(12) United States Patent
Lim et al.

(10) Patent No.: US 10,217,771 B2
(45) Date of Patent: Feb. 26, 2019

(54) THIN FILM TRANSISTOR ARRAY PANEL AND MANUFACTURING METHOD THEREOF

(71) Applicant: SAMSUNG DISPLAY CO., LTD., Yongin-si, Gyeonggi-Do (KR)

(72) Inventors: Ji Hun Lim, Goyang-si (KR); Joon Seok Park, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/436,066

(22) Filed: Feb. 17, 2017

(65) Prior Publication Data
US 2017/0373091 A1    Dec. 28, 2017

(30) Foreign Application Priority Data
Jun. 23, 2016   (KR) .................... 10-2016-0078852

(51) Int. Cl.
*H01L 27/12*    (2006.01)
*H01L 29/423*   (2006.01)
(Continued)

(52) U.S. Cl.
CPC ........ *H01L 27/124* (2013.01); *H01L 27/1225* (2013.01); *H01L 27/1248* (2013.01);
(Continued)

(58) Field of Classification Search
CPC ............... H01L 27/124; H01L 27/1225; H01L 29/7869; H01L 29/66969; H01L 27/1259;
(Continued)

(56) References Cited

U.S. PATENT DOCUMENTS

| 2002/0033484 A1* | 3/2002 | Jeong ................ H01L 23/53242 |
|---|---|---|
| | | 257/72 |
| 2005/0037551 A1 | 2/2005 | Moriguchi et al. |

(Continued)

FOREIGN PATENT DOCUMENTS

| CN | 104882485 | 9/2015 |
|---|---|---|
| EP | 0542279 | 5/1993 |

(Continued)

OTHER PUBLICATIONS

Munzenrieder, et al., "Flexible Self-Aligned Double-Gate IGZO TFT", IEE Electron Device Letters, vol. 35, No. 1, Jan. 2014, pp. 69-71.

(Continued)

*Primary Examiner* — Thanh Y Tran
(74) *Attorney, Agent, or Firm* — F. Chau & Associates, LLC

(57) ABSTRACT

A thin film transistor array panel according to an exemplary embodiment of the present invention includes: a substrate; a gate electrode on the substrate; a gate insulating layer on the gate electrode; a semiconductor member including a channel region overlapping the gate electrode with the gate insulating layer interposed therebetween, and a source region and a drain region that face each other with the channel region interposed therebetween; an interlayer insulating layer on the semiconductor member; a data conductor on the interlayer insulating layer; and a passivation layer on the data conductor, wherein the interlayer insulating layer has a first hole on the channel region.

14 Claims, 23 Drawing Sheets

(51) Int. Cl.
*H01L 29/66* (2006.01)
*H01L 29/786* (2006.01)
*H01L 29/417* (2006.01)

(52) U.S. Cl.
CPC .... *H01L 27/1259* (2013.01); *H01L 29/41733* (2013.01); *H01L 29/42356* (2013.01); *H01L 29/42384* (2013.01); *H01L 29/66765* (2013.01); *H01L 29/66969* (2013.01); *H01L 29/7869* (2013.01); *H01L 29/78618* (2013.01); *H01L 29/78669* (2013.01)

(58) Field of Classification Search
CPC ........... H01L 29/42384; H01L 27/1248; H01L 29/42356; H01L 29/78618
See application file for complete search history.

(56) References Cited

U.S. PATENT DOCUMENTS

| | | | | |
|---|---|---|---|---|
| 2010/0006833 | A1* | 1/2010 | Ha | H01L 29/7869 257/43 |
| 2012/0043543 | A1* | 2/2012 | Saito | H01L 29/66765 257/57 |
| 2012/0070946 | A1 | 3/2012 | Hsieh | |
| 2012/0080663 | A1 | 4/2012 | Lee et al. | |
| 2015/0060843 | A1* | 3/2015 | Lee | H01L 29/7869 257/43 |
| 2015/0187750 | A1 | 7/2015 | Kim et al. | |
| 2015/0214248 | A1 | 7/2015 | Chou | |
| 2016/0211277 | A1 | 7/2016 | Yan et al. | |
| 2016/0260924 | A1* | 9/2016 | Lee | H01L 51/0545 |
| 2016/0293770 | A1 | 10/2016 | Peng | |
| 2017/0005152 | A1* | 1/2017 | Hong | H01L 27/3248 |

FOREIGN PATENT DOCUMENTS

| | | |
|---|---|---|
| JP | 2014-192420 | 10/2014 |
| KR | 10-0770470 | 10/2007 |
| KR | 10-0817215 | 3/2008 |
| KR | 10-0832873 | 5/2008 |
| KR | 10-2013-0136063 | 12/2013 |
| WO | 2015000255 | 1/2015 |

OTHER PUBLICATIONS

Wu, et al., "Self-Aligned Top-Gate Coplanar In—Ga—Zn—O Thin-Film Transistors", Journal of Display Technology, vol. 5, No. 12, Dec. 2009, pp. 515-519.
European Search Report dated Nov. 22, 2017 in corresponding European Patent Application No. 17176847.6 (8 pages).

* cited by examiner

THIN FILM TRANSISTOR ARRAY PANEL AND MANUFACTURING METHOD THEREOF

CROSS-REFERENCE TO RELATED APPLICATION

This application claims priority to and the benefit of Korean Patent Application No. 10-2016-0078852 filed in the Korean Intellectual Property Office on Jun. 23, 2016, the entire contents of which are incorporated by reference herein.

TECHNICAL FIELD

The present invention relates to a thin film transistor array panel and a manufacturing method thereof.

DISCUSSION OF RELATED ART

Various electronic devices, such as a display device, may include a thin film transistor array panel which includes a thin film transistor.

The thin film transistor includes a gate electrode and a semiconductor member. The semiconductor member overlaps the gate electrode with an insulating layer interposed therebetween, and forms a channel region in the overlapping area. Amorphous or polycrystalline silicon (Si), oxide semiconductor, and the like are widely used as materials for the semiconductor member.

The semiconductor member also includes a source region and a drain region that are connected to the channel region, and also respectively connected to a source electrode and a drain electrode that are formed in a different layer from the semiconductor member.

The quality of the electronic device including the thin film transistor array panel is affected by characteristics of the thin film transistor.

SUMMARY

Exemplary embodiments of the present invention provide enhanced characteristics of a thin film transistor in a thin film transistor array panel, and high resolution of a display device including the thin film transistor array panel.

A thin film transistor array panel according to an exemplary embodiment of the present invention includes: a substrate; a gate electrode on the substrate; a gate insulating layer on the gate electrode; a semiconductor member including a channel region overlapping the gate electrode with the gate insulating layer interposed therebetween, and a source region and a drain region that face each other with the channel region interposed therebetween; an interlayer insulating layer on the semiconductor member; a data conductor on the interlayer insulating layer; and a passivation layer on the data conductor, in which the interlayer insulating layer has a first hole on the channel region.

The passivation layer may include a portion positioned in the first hole.

A plane separation distance between the data conductor and the gate electrode may be naught or greater than zero.

An insulating barrier layer on the channel region may be further included, a width of the insulating barrier layer in a first direction may be smaller than a width of the semiconductor member in the first direction, and a width of the first hole in the first direction may be equal to or greater than a width of the channel region in the first direction.

The passivation layer may be in contact with an upper surface of the insulating barrier layer in the first hole.

The insulating barrier layer may include silicon oxide, and the interlayer insulating layer may include silicon nitride.

An edge of the gate electrode may be aligned with an edge of the channel region.

The passivation layer may be in contact with an upper surface of the channel region in the first hole.

An edge of the gate electrode may be aligned with an edge of the channel region.

The interlayer insulating layer may include silicon nitride.

The semiconductor member may further include a buffer region positioned between the source region and the channel region, and a carrier concentration of the buffer region may be between a carrier concentration of the source region and a carrier concentration of the channel region.

The edge of the gate electrode may be aligned with a boundary between the channel region and the buffer region.

A method for manufacturing a thin film transistor array panel according to an exemplary embodiment of the present invention includes: forming a gate electrode on a substrate; forming a gate insulating layer on the gate electrode; forming a semiconductor member on the gate insulating layer; depositing a doping barrier layer on the semiconductor member; patterning the doping barrier layer to form a barrier pattern overlapping the gate electrode and exposing at least a part of the semiconductor member; forming an interlayer insulating layer on the barrier pattern and the exposed semiconductor member; patterning the interlayer insulating layer to form a first hole exposing the barrier pattern; depositing a conductive layer on the interlayer insulating layer; patterning the conductive layer to form a data conductor; removing the barrier pattern; and forming a passivation layer on the data conductor.

The conductive layer may be in contact with an upper surface of the barrier pattern, and the removing of the barrier pattern may be executed along with the patterning of the conductive layer or after the patterning of the conductive layer.

In the forming of the first hole, the first hole may expose an entire portion of the barrier pattern.

The edge of the barrier pattern may be aligned with the edge of the gate electrode.

The doping barrier layer may include a metal including titanium.

An insulating layer may be deposited on the semiconductor member before depositing the doping barrier layer on the semiconductor member, and in the forming of the barrier pattern, the insulating layer may be patterned to form an insulating barrier layer between the barrier pattern and the semiconductor member.

The passivation layer may be in contact with an upper surface of the insulating barrier layer.

After forming the barrier pattern, the edge part of the insulating barrier layer may not be covered by the barrier pattern, and may be exposed.

A thin film transistor array panel according to an exemplary embodiment of the present invention includes: a substrate; a gate electrode disposed on the substrate; a gate insulating layer disposed on the gate electrode; a semiconductor member disposed on the gate insulating layer, and including a source region, a drain region, and a channel region interposed between the source region and the drain region; an insulating barrier layer disposed on the channel region; and a first part and a second part of a data conductor disposed on the source region and the drain region, respectively, in which the gate electrode is positioned at an opposite side of the data conductor based on the semiconductor member, and an edge of the channel region is aligned with an edge of the gate electrode or overlapped with the gate electrode.

The data conductor may not overlap the gate electrode.

An edge of the channel region may be aligned with an edge of the insulating barrier layer or overlapped with the insulating barrier layer.

According to exemplary embodiments of the present invention, in the thin film transistor array panel, parasitic capacitance between the gate electrode and the source electrode or the drain electrode is reduced such that characteristics of the thin film transistor may be enhanced, high resolution of the display device including the thin film transistor array panel may be obtained, and a variety of effects may be additionally provided.

BRIEF DESCRIPTION OF THE DRAWINGS

Exemplary embodiments of the present invention will be more clearly understood from the following detailed description taken in conjunction with the accompanying drawings in which.

Figure 1:
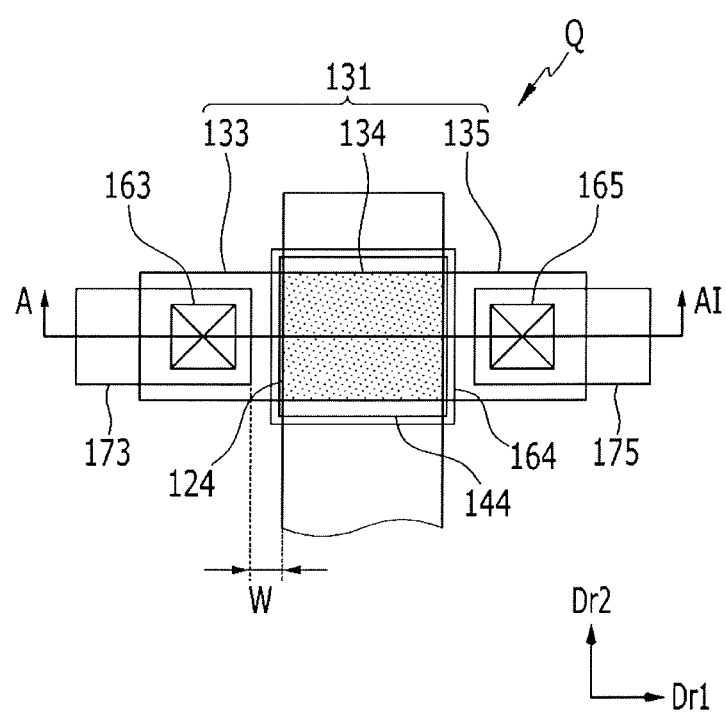
FIG. 1 is a top plan view of a thin film transistor included in a thin film transistor array panel according to an exemplary embodiment of the present invention.

Since the drawings in FIGS. 1-32 are intended for illustrative purposes, the elements in the drawings are not necessarily drawn to scale. For example, some of the elements may be enlarged or exaggerated for clarity purpose

DETAILED DESCRIPTION OF THE EMBODIMENTS

The present invention will be described more fully hereinafter with reference to the accompanying drawings, in which exemplary embodiments of the present invention are shown. As those skilled in the art would realize, the described exemplary embodiments herein may be modified in various different ways, all without departing from the spirit or scope of the present invention.

To clearly explain the present invention, portions that are not directly related to the present invention are omitted, and the same reference numerals are referred to the same or similar constituent elements throughout the entire specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" may mean positioned on or below the object portion, and does not necessarily mean positioned on the upper side of the object portion based on a gravitational direction.

As used herein, the singular forms "a", "an" and "the" are intended to include the plural forms as well, unless the context clearly indicates otherwise.

In addition, unless explicitly described to the contrary, the word "comprise" and variations such as "comprises" or "comprising" will be understood to imply the inclusion of stated elements but not the exclusion of any other elements.

Now, a thin film transistor array panel according to an exemplary embodiment of the present invention will be described with reference to FIG. 1 and FIG. 2.

The thin film transistor array panel according to an exemplary embodiment of the present invention includes a thin film transistor Q. The thin film transistor Q may be positioned on one surface of a substrate 110. The substrate 110 may include an insulating material such as glass or plastic, and may be a film type.

Figure 2:
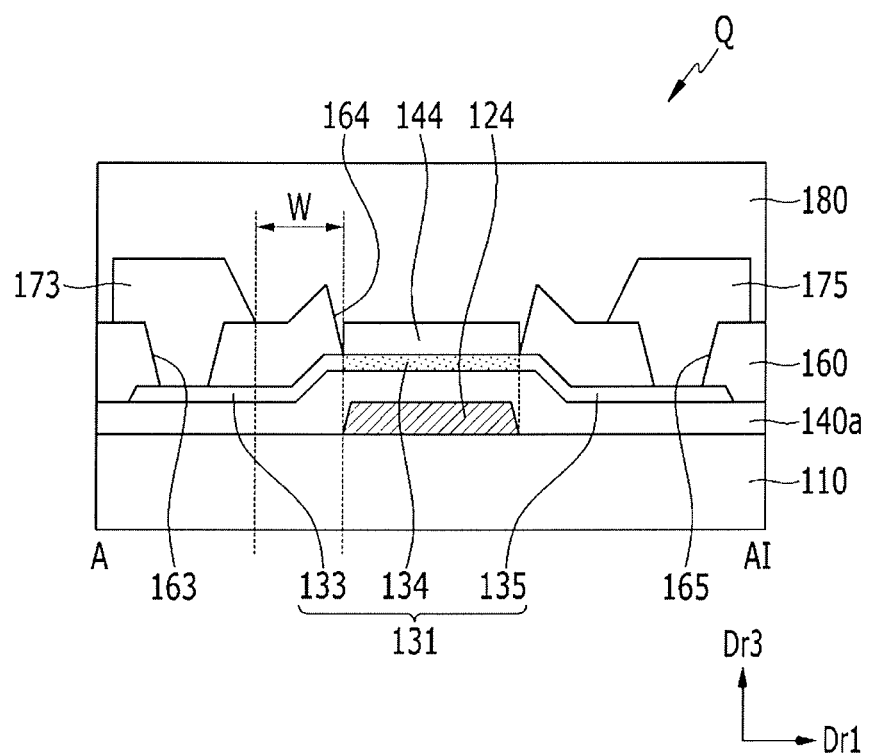
FIG. 2 is a cross-sectional view of the thin film transistor array panel shown in FIG. 1 taken along line A-AI.

A first direction Dr1 and a second direction Dr2 shown in FIG. 1 as directions parallel to a main surface of the substrate 110 are perpendicular to each other, and a third direction Dr3 shown in FIG. 2 as a direction perpendicular to the first and second directions Dr1 and Dr2 is a direction substantially perpendicular to the main surface of the substrate 110. The third direction Dr3 may be mainly expressed in a cross-sectional structure, and may be referred to as a cross-sectional direction. A structure shown when observing the surface parallel in the first direction Dr1 and the second direction Dr2 is referred to as a plane structure. The plane structure may disregard any separation in the third direction Dr3 for those components of the structure under observation. For example, the plan structure may be shown as a top plan view structure.

The thin film transistor Q includes a gate electrode 124 positioned on one surface of the substrate 110. The gate electrode 124 may include a metal such as, for example, aluminum (Al), silver (Ag), copper (Cu), molybdenum (Mo), chromium (Cr), tantalum (Ta), or titanium (Ti), or an alloy thereof, and may have a structure of a single layer or a multilayer including at least one of these materials.

A gate insulating layer 140a is positioned on the gate electrode 124. The gate insulating layer 140a may include a portion that overlaps the gate electrode 124, and a portion that is positioned on the substrate 110 and does not overlap the gate electrode 124.

The gate insulating layer 140a may include an inorganic insulating material such as, for example, silicon oxide (SiOx), silicon nitride (SiNx), or silicon oxynitride (SiON), or an organic insulating material, and may have a structure of a single layer or a multilayer including at least one of these materials. Particularly, the gate insulating layer 140a of the single layer or a highest layer of the gate insulating layer 140a of the multilayer includes an oxide-based insulating material in which a content of hydrogen (H) is relatively low, thereby preventing hydrogen (H) from inflowing to a semiconductor member 131.

The semiconductor member 131 is positioned on the gate insulating layer 140a. The semiconductor member 131 may include, for example, amorphous silicon, polysilicon, oxide semiconductor, or the like, and may have a structure of a single layer or a multilayer including at least one of these materials. In this case, the oxide semiconductor, for example, may be formed of an oxide of a metal such as zinc (Zn), indium (In), gallium (Ga), tin (Sn), titanium (Ti), or the like, or an oxide of a combination of metals such as at least two of zinc (Zn), indium (In), gallium (Ga), tin (Sn), titanium (Ti), and the like. For example, the oxide semiconductor may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO).

The semiconductor member 131 includes a channel region 134, a source region 133, and a drain region 135. The channel region 134 is interposed between the source region 133 and the drain region 135.

The channel region 134 is a region where the channel is formed when the thin film transistor Q is turned on, and overlaps the gate electrode 124 with the gate insulating layer 140a interposed therebetween. In the plane structure, the channel region 134 may be completely superimposed with the gate electrode 124. In detail, a width of the gate electrode 124 in the first direction Dr1 may be substantially the same as or larger than the width of the channel region 134 in the first direction Dr1.

Right and left edges of the channel region 134, that is, a boundary between the channel region 134 and the source region 133 and a boundary between the channel region 134 and the drain region 135, may be aligned with the right and left edges of the gate electrode 124. In this case, the right and left edges of the gate electrode 124 that may be aligned with the right and left edges of the channel region 134 may each be an edge shown outermost in the plane structure. In this case, the width of the channel region 134 in the first direction Dr1 may be substantially the same as that of the gate electrode 124 in the first direction Dr1. Alternatively, the edge of the gate electrode 124 may overlap the source region 133 and the drain region 135 on a plane. In this case, the width of the gate electrode 124 in the first direction Dr1 may be slightly larger than the width of the channel region 134 in the first direction Dr1.

The source region 133 and the drain region 135 are positioned at respective sides of the channel region 134 and are separated from each other. The source region 133 and the drain region 135 are positioned at the same layer as the channel region 134 and are connected to the channel region 134. A carrier concentration of the source region 133 and the drain region 135 may be larger than a carrier concentration of the channel region 134, and the source region 133 and the drain region 135 may be conductive. A gradient region where the carrier concentration is gradually changed may be formed between the source region 133 and the channel region 134, and between the drain region 135 and the channel region 134.

When the semiconductor member 131 includes oxide semiconductor, the source region 133 and the drain region 135 may include a material in which the amount of the oxide semiconductor is reduced. For example, the source region 133 and the drain region 135 may further include at least one of fluorine (F), hydrogen (H), and sulfur (S), as opposed to the channel region 134. A metal included in a semiconductor member 131 may be precipitated at the surface of the source region 133 and the drain region 135.

The gate electrode 124 and the semiconductor member 131 together form the thin film transistor Q.

An insulating barrier layer 144 is positioned on the channel region 134. A lower surface of the insulating barrier layer 144 may be in contact with an upper surface of the channel region 134.

In the plane structure, the insulating barrier layer 144 may completely overlap the channel region 134. In detail, the width of the insulating barrier layer 144 in the first direction Dr1 may be substantially equal to or larger than the width of the channel region 134 in the first direction Dr1. In other words, the right and left edges of the channel region 134, that is, the boundary between the channel region 134 and the source region 133 and the boundary between the channel region 134 and the drain region 135, may be aligned with the right and left edges of the insulating barrier layer 144, or the right and left edges of the channel region 134 may overlap the insulating barrier layer 144 on a plane. The width of the insulating barrier layer 144 in the first direction Dr1 is smaller than the width of the semiconductor member 131 in the first direction Dr1.

The insulating barrier layer 144 may include an inorganic insulating material such as, for example, silicon oxide (SiOx), silicon nitride (SiNx), or silicon oxynitride (SiON), or an organic insulating material, and may have a structure of a single layer or a multilayer including at least one of these materials. Particularly, in the case that the semiconductor member 131 includes oxide semiconductor, the insulating barrier layer 144 of the single layer or a lowest layer of the insulating barrier layer 144 of the multilayer may include the inorganic insulating material of which an amount of hydrogen (H) is relatively low such as silicon oxide (SiOx) for protection of the channel region 134.

The insulating barrier layer 144 may be omitted, if necessary.

An interlayer insulating layer 160 is positioned on the semiconductor member 131. The interlayer insulating layer 160 may be a layer that is separately formed in a process different from that of the insulating barrier layer 144 after forming the insulating barrier layer 144. The interlayer insulating layer 160 has a plurality of holes 163, 164, and 165 in which the interlayer insulating layer 160 is removed. The hole 164 overlaps the insulating barrier layer 144 and is formed on the insulating barrier layer 144, the hole 163 overlaps the source region 133 and is formed on the source region 133, and the hole 165 overlaps the drain region 135 and is formed on the drain region 135.

Referring to FIG. 2, the interlayer insulating layer 160 may not cover most of the insulating barrier layer 144 in the hole 164, and the insulating barrier layer 144 may be positioned in the hole 164. Also, the channel region 134 may completely overlap the hole 164, and a plane size of the hole 164 may be equal to or slightly larger than the plane size of the channel region 134. In other words, the width of the hole 164 in the first direction Dr1 may be greater than the width of the channel region 134 in the first direction Dr1. The width of the hole 164 in the first direction Dr1 may be smaller than the width of the semiconductor member 131 in the first direction Dr1.

The thin film transistor Q may be configured differently from FIG. 2. For example, the interlayer insulating layer 160 may cover and overlap an edge part of the insulating barrier layer 144.

The interlayer insulating layer 160 may include an inorganic insulating material such as, for example, silicon oxide (SiOx), silicon nitride (SiNx), silicon oxynitride (SiON), and silicon oxyfluoride (SiOF), or an organic insulating material, and may be a single layer or a multilayer including at least one of these materials. Particularly, when the semiconductor member 131 includes oxide semiconductor, the interlayer insulating layer 160 of the single layer or the lowest layer of the interlayer insulating layer 160 of the multilayer may include a nitride-based inorganic insulating material containing a relatively large amount of hydrogen (H) such as silicon nitride (SiNx). Alternatively, in a case of the multi-layered interlayer insulating layer 160, a layer including silicon oxide (SiOx), for example, may be positioned on the lowest layer.

A data conductor including a first connection part 173 and a second connection part 175 is positioned on the interlayer insulating layer 160. The first connection part 173 is electrically connected to the source region 133 of the thin film transistor Q through the hole 163 of the interlayer insulating layer 160, and the second connection part 175 is electrically connected to the drain electrode 135 of the thin film transistor Q through the hole 165 of the interlayer insulating layer 160. The first connection part 173 and the second connection part 175 may not overlap the gate electrode 124 on a plane. That is, in the plane structure, a separation distance W between the first connection part 173 or the second connection part 175 and the gate electrode 124 may be naught or greater than zero. In other words, the first connection part 173 or the second connection part 175 may have its edge superimposed with or separated from the edge of the gate electrode 124 in the plane structure.

The first connection part 173 and the second connection part 175 may include a conductive material of a metal such as, for example, aluminum, silver, copper, molybdenum, chromium, tantalum, or titanium, or an alloy thereof, and may have a structure of a single layer or a multilayer including at least one of these materials.

The source region 133 and the first connection part 173 connected thereto may function as a source electrode of the thin film transistor Q, and the drain region 135 and the second connection part 175 connected thereto may function as a drain electrode of the thin film transistor Q.

At least one of the first connection part 173 and the second connection part 175 may be omitted depending on the kind of the thin film transistor Q to be formed.

A passivation layer 180 may be positioned on the insulating barrier layer 144, and the first connection part 173 and the second connection part 175. The passivation layer 180 may include an inorganic insulating material such as, for example, silicon oxide (SiOx), silicon nitride (SiNx), or aluminum oxide (AlOx), or an organic insulating material, and may have a structure of a single layer or a multilayer. An upper surface of the passivation layer 180 may be substantially flat.

The passivation layer 180 may directly contact the upper surface of the insulating barrier layer 144 and the upper surface of the interlayer insulating layer 160. The passivation layer 180 may include a part positioned in the hole 164. Even if the passivation layer 180 includes a material the same as that of the insulating barrier layer 144 or the interlayer insulating layer 160, layer qualities thereof are different from each other such that a boundary may be formed between the insulating barrier layer 144 and the passivation layer 180 or between the interlayer insulating layer 160 and the passivation layer 180.

A characteristic of the thin film transistor Q according to the present exemplary embodiment will be described with reference to the structure of the thin film transistor according to a conventional art shown in FIG. 3 and FIG. 4 and a characteristic graph of the thin film transistor shown in FIG. 5 to FIG. 8.

Figure 3:
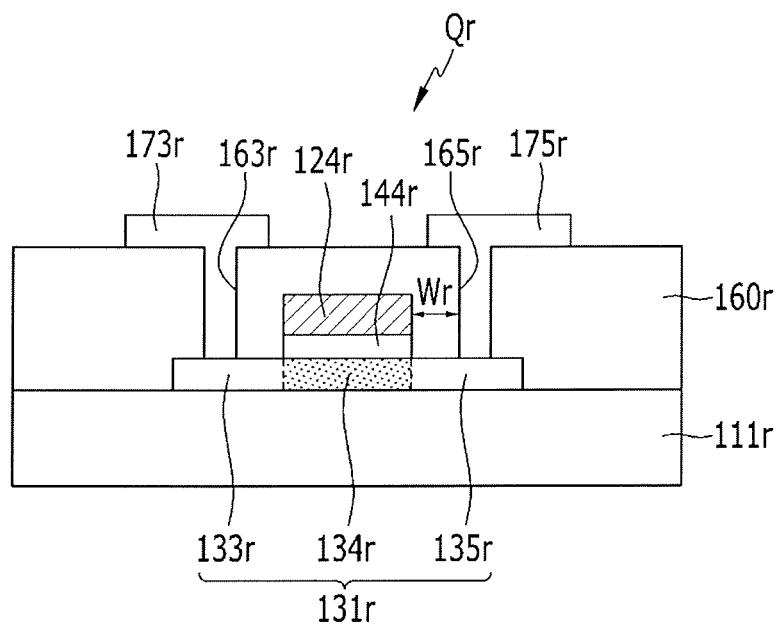
FIG. 3 and FIG. 4 are cross-sectional views of a thin film transistor array panel according to a conventional art, respectively.
Figure 4:
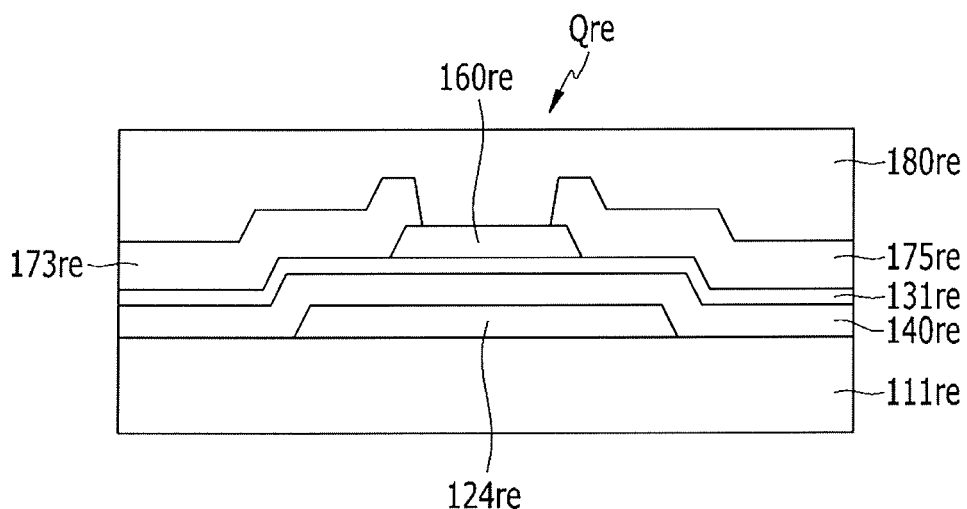

FIG. 3 and FIG. 4 are cross-sectional views of a part of a thin film transistor array panel according to a conventional art, respectively.

Referring to FIG. 3, a thin film transistor Qr according to a conventional art includes a semiconductor member 131r positioned on a substrate 111r and including a source region 133r, a drain region 135r, and a channel region 134r, a gate insulating layer 144r positioned on the channel region 134r, and a gate electrode 124r positioned on the gate insulating layer 144r. An insulating layer 160r is positioned on the thin film transistor Qr, and a first connection part 173r and a second connection part 175r positioned on the insulating layer 160r may be connected to the source region 133r and the drain region 135r through holes 163r and 165r of the insulating layer 160r, respectively.

Referring to FIG. 4, a thin film transistor Qre having a structure different from that of the thin film transistor Qr according to a conventional art includes a gate electrode 124re positioned on a substrate 111re, a gate insulating layer 140re positioned on the gate electrode 124re, a semiconductor member 131re positioned on the gate insulating layer 140re, an etch stopper 160re positioned on the semiconductor member 131re, a source electrode 173re and a drain electrode 175re positioned on the semiconductor member 131re and the etch stopper 160re, and a passivation layer 180re positioned on the source electrode 173re and the drain electrode 175re.

Figure 5:
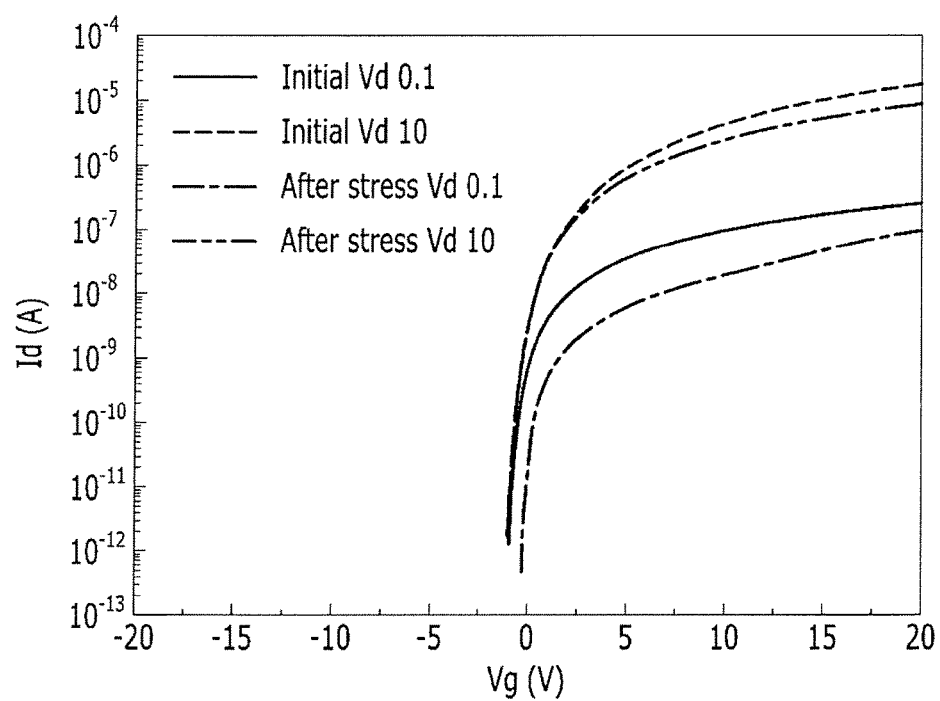
FIG. 5 is a graph showing a characteristic of a thin film transistor according to a conventional art.

FIG. 5 shows a drain current Id vs a gate voltage Vg (Id–Vg) characteristic depending on various drain voltages (Vd=0.1 V, 10 V) before applying a stress to the thin film transistor Qre according to the conventional art shown in FIG. 4 (Initial), and a drain current Id vs a gate voltage Vg (Id–Vg) characteristic depending on various drain voltages (Vd=0.1 V, 10 V) after applying the stress (After stress). The stress applied to the thin film transistor Qre, for example, may be one in which a source-drain voltage Vds is a very high voltage (e.g., Vds=80 V, Vgs=0 V). As shown in the graph of FIG. 5, compared with before applying the stress to the thin film transistor Qre, the Id–Vg characteristic change of the thin film transistor Qre is large after applying the stress.

Figure 6:
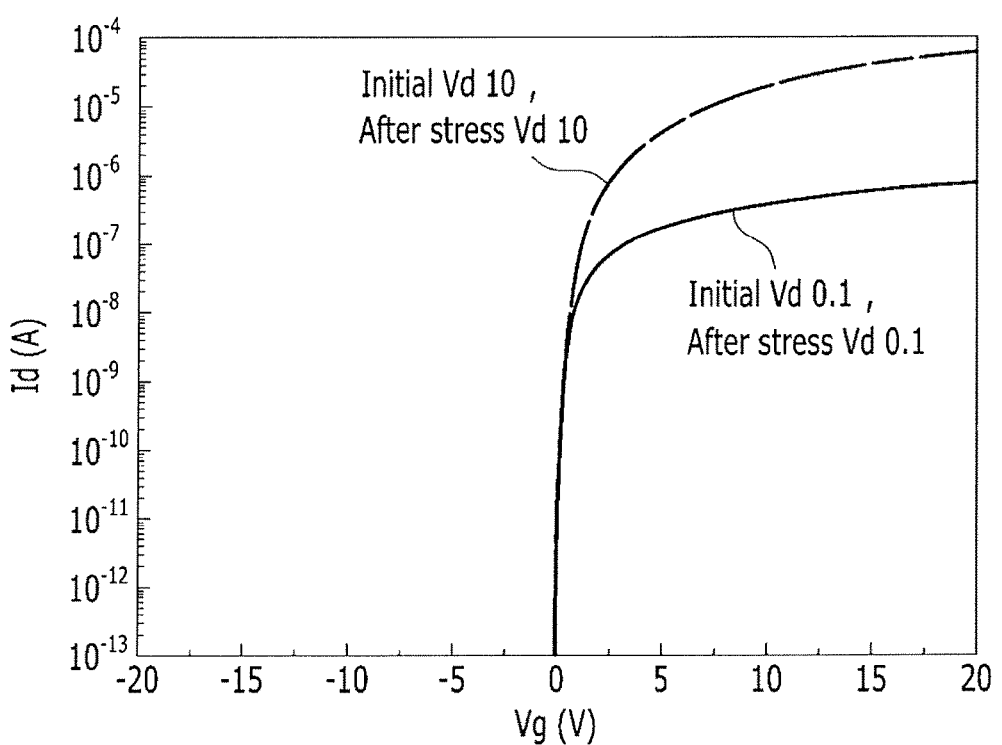
FIG. 6 is a graph showing a characteristic of a thin film transistor included in a thin film transistor array panel according to an exemplary embodiment of the present invention.

FIG. 6 is a graph showing a drain current (Id) vs a gate voltage (Vg) (Id–Vg) characteristic of a thin film transistor included in a thin film transistor array panel according to an exemplary embodiment of the present invention. Referring to FIG. 6, the thin film transistor Q according to an exemplary embodiment of the present invention exhibits the same Id–Vg characteristic before receiving the stress and after receiving the stress in the same condition as the thin film transistor Qre such that it may be confirmed that the Id–Vg characteristic of the thin film transistor Q is enhanced.

In the case of the thin film transistor Qre according to the conventional art shown in FIG. 4, since the source electrode 173re and the drain electrode 175re are directly connected to the semiconductor region of the semiconductor member 131re, a strong electric field is formed near the connection part thereof, particularly, the semiconductor member 131re is weak against the stress for the high voltage in the high source-drain voltage Vds such that the reliability of the thin film transistor Qre is reduced. However, according to the present exemplary embodiment, while the gate electrode 124 is disposed under the semiconductor member 131 like the thin film transistor Qre shown in FIG. 4, the first connection part 173 and the second connection part 175 functioning as the source electrode and the drain electrode are not directly connected with the channel region 134, but are connected to the channel region 134 through the source region 133 and the drain region 135, thus even if the high source-drain voltage Vds is applied, a relatively small electric field is formed on the semiconductor member 131 such that the reliability against the high voltage stress of the thin film transistor Q may be enhanced.

In the case of the thin film transistor Qre according to the conventional art shown in FIG. 4, the gate electrode 124re vertically overlaps the source electrode 173re and the drain electrode 175re in the third direction. Accordingly, a parasitic capacitance Cgs is generated between the gate electrode 124re and the source electrode 173re or between the gate electrode 124e and the drain electrode 175re such that there are problems associated with a voltage being insufficiently applied to another electrode (e.g., a pixel electrode) connected to the thin film transistor Qre due to an RC delay, so a kickback voltage and a consumption power increases. However, according to an exemplary embodiment of the present invention, because the gate electrode 124 only mainly overlaps the channel region 134 but does not vertically overlap the source region 133, the drain region 135, the first connection part 173 and the second connection part 175 in the third direction (vertical direction), the parasitic capacitance Cgs is not generated between the gate electrode 124 and the source region 133, the drain region 135, the first connection part 173, and the second connection part 175, and accordingly the problems due to the parasitic capacitance Cgs are not generated and the thin film transistor Q and electrical elements connected thereto may be driven by lower power.

Figure 7:
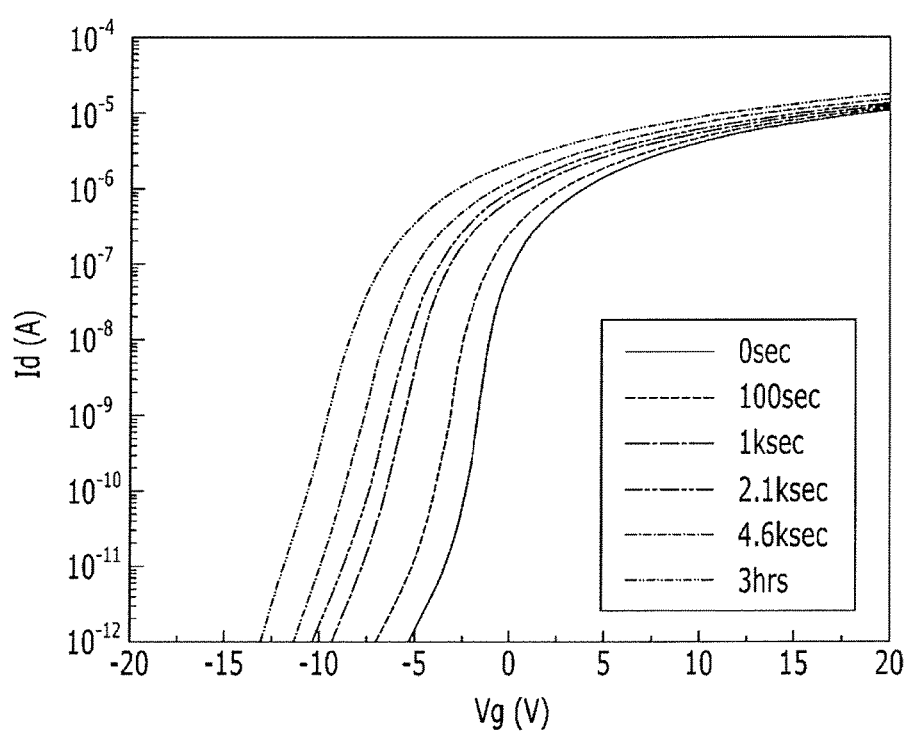
FIG. 7 is a graph showing a characteristic of a thin film transistor according to a conventional art.

FIG. 7 is a graph showing the drain current (Id) vs the gate voltage (Vg) (Id–Vg) characteristic of the thin film transistor Qr depending on different amounts of time (0 s-3 h) in which a negative bias is applied to the gate electrode 124r of the thin film transistor Qr according to the conventional art shown in FIG. 3. As shown in the graph of FIG. 7, the Id–Vg characteristic change of the thin film transistor Qr is large depending on the amount of time that the negative bias is applied to the gate electrode 124r of the thin film transistor Qr.

Figure 8:
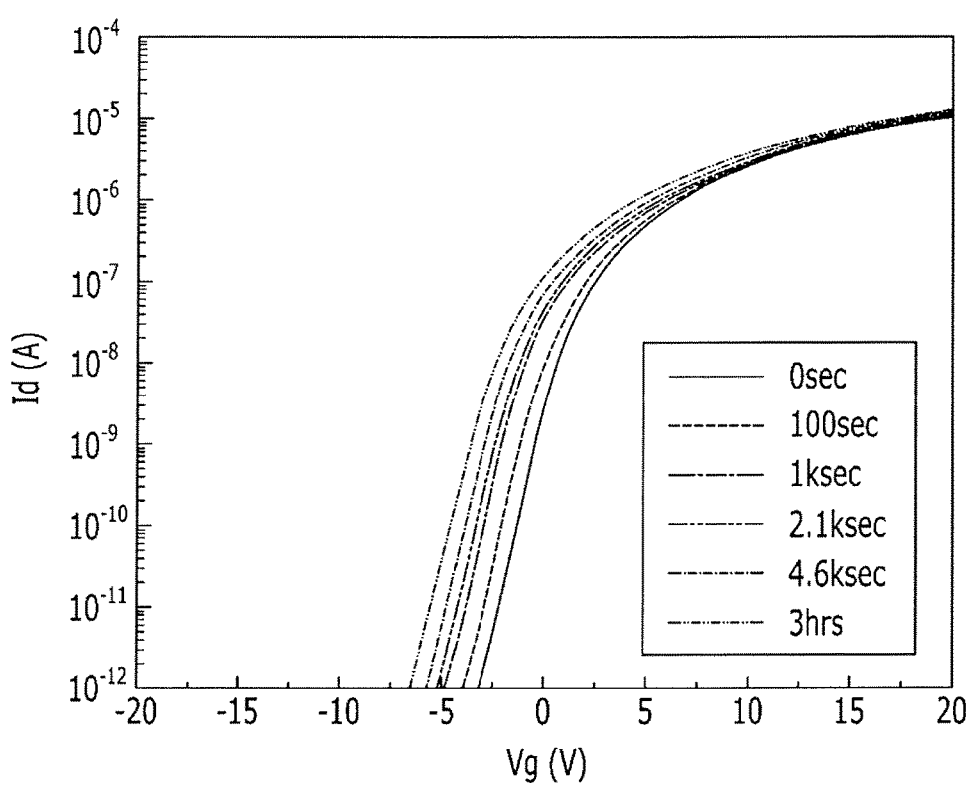
FIG. 8 is a graph showing a characteristic of a thin film transistor included in a thin film transistor array panel according to an exemplary embodiment of the present invention.

FIG. 8 is the graph showing the drain current (Id) vs the gate voltage (Vg) (Id–Vg) characteristic of the thin film transistor Q depending on different amounts of time (0 sec-3 hrs) in which the negative bias is applied to the gate electrode 124 of the thin film transistor Q included in the thin film transistor array panel according to an exemplary embodiment of the present invention. Referring to FIG. 8, for the thin film transistor Q according to an exemplary embodiment of the present invention, it may be confirmed that the Id–Vg characteristic change of the thin film transistor Q is small compared with that of the thin film transistor Qre of the conventional art.

In the case of the thin film transistor Qr according to the conventional art shown in FIG. 3, the gate electrode 124r is positioned at the same side as the first connection part 173r and the second connection part 175r based on the semiconductor member 131r such that there is a risk of short being generated between the gate electrode 124r, and the first connection part 173r and the second connection part 175r, thereby between the gate electrode 124r, and the first connection part 173r and the second connection part 175r, each must be formed with a space margin having a predetermined distance. The predetermined distance is a smallest distance sufficient to prevent short between the gate electrode 124r and the first connection part 173r or between the gate electrode 124r and the second connection part 175r. That is, it must be designed such that a plane separation distance Wr between the gate electrode 124r and the first connection part 173r or between the gate electrode 124r and the second connection part 175r shown in FIG. 3 has a predetermined value or a value larger than the predetermined value. However, according to an exemplary embodiment of the present invention, the gate electrode 124 is positioned at the opposite side to the first connection part 173 and the second connection part 175 based on the semiconductor member 131 and other conductors are not positioned on the channel region 134 such that the risk of short being generated between the first connection part 173 and the second connection part 175, and the gate electrode 124, or between other conductors on the channel region 134, is small, thereby reducing a space margin on a plane between the gate electrode 124 and the first connection part 173 or between the gate electrode 124 and the second connection part 175. That is, the plane separation distance W, a separation distance in the first direction Dr1 here, between the gate electrode 124 and the first connection part 173 or the second connection part 175 shown in FIG. 1 and FIG. 2 may be reduced and the plane separation distance W may be naught or greater than zero. Accordingly, a plane size of the thin film transistor Q may be reduced compared with that of the conventional art, thereby realizing high resolution for the thin film transistor array panel.

In the case of the thin film transistor Qr according to the conventional art shown in FIG. 3, the gate electrode 124r is positioned at the same side as the first connection part 173r and the second connection part 175r based on the semiconductor member 131r such that the parasitic capacitance Cgs on a plane is generated between the gate electrode 124r and the first connection part 173r and between the gate electrode 124r and the second connection part 175r, thereby causing the above-described problems due to the parasitic capacitance Cgs. However, according to an exemplary embodiment of the present invention, the gate electrode 124 is positioned at the opposite side to the first connection part 173 and the second connection part 175 based on the semiconductor member 131 such that the first connection part 173 and the second connection part 175 are not adjacent to the gate electrode 124 on a plane. Also, other conductors adjacent to the first and second connection parts 173 and 175 do not exist on the channel region 134. Accordingly, the plane parasitic capacitance Cgs is not generated between the gate electrode 124 and the first connection part 173 and between the gate electrode 124 and the second connection part 175, such that the problems due to the parasitic capacitance Cgs are not generated and the thin film transistor Q and the electrical elements connected thereto may be driven by lower power.

As described above, the thin film transistor Q according to an exemplary embodiment of the present invention has the merits of solving all drawbacks compared with the thin film transistor of any structure according to the conventional art, such that the thin film transistor array panel having high resolution and driven with low power may be provided, and the thin film transistor having the enhanced characteristic in any voltage condition and time condition may be provided.

A manufacturing method of the thin film transistor array panel according to an exemplary embodiment of the present invention will be described with reference to FIG. 9 to FIG. 15 along with the above-described drawings. Particularly, the manufacturing method of the thin film transistor array panel according to the above-described exemplary embodiment shown in FIG. 1 and FIG. 2 will be described.

Figure 9:
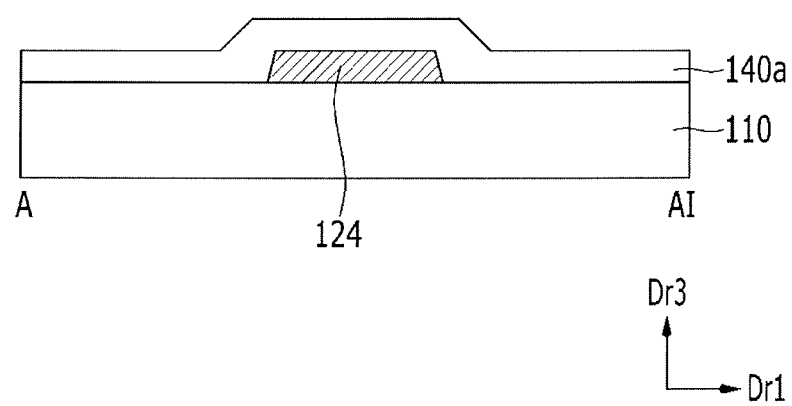
FIG. 9 to FIG. 15 are cross-sectional views sequentially showing a structure in each process according to a manufacturing method of a thin film transistor array panel according to an exemplary embodiment of the present invention.

First, referring to FIG. 9, a conductive material, for example, at least one of the metals such as, for example, aluminum (Al), silver (Ag), copper (Cu), molybdenum (Mo), chromium (Cr), tantalum (Ta), titanium (Ti), and the like, or alloys thereof, is deposited on a substrate 110 including an insulating material of glass or plastic, and is patterned to form a gate electrode 124 with a structure of a single layer or a multilayer.

Next, an inorganic insulating material such as, for example, silicon oxide (SiOx), silicon nitride (SiNx), or silicon oxynitride (SiON), or an organic insulating material is deposited on the gate electrode 124 and the substrate 110 to form a gate insulating layer 140a with a structure of a single layer or a multilayer.

Figure 10:
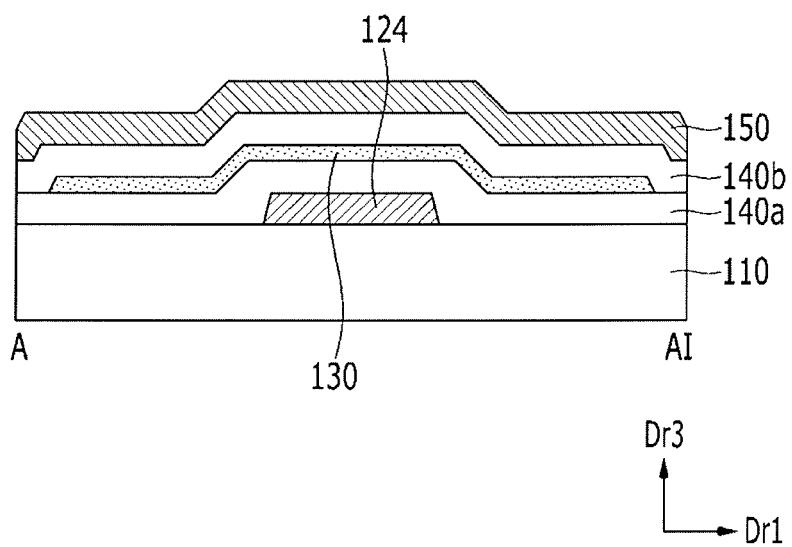

Referring to FIG. 10, amorphous silicon, polysilicon, or an oxide semiconductor material such as, for example, zinc oxide (ZnO), zinc-tin oxide (ZTO), zinc-indium oxide (ZIO), indium oxide (InO), titanium oxide (TiO), indium-gallium-zinc oxide (IGZO), or indium-zinc-tin oxide (IZTO) is then deposited on the gate insulating layer 140a and patterned to form a semiconductor member 130.

Next, an inorganic insulating material such as, for example, silicon oxide (SiOx), silicon nitride (SiNx), or silicon oxynitride, or an organic insulating material is deposited on the semiconductor member 130 and the gate insulating layer 140a to form an insulating layer 140b with a structure of a single layer or a multilayer. Particularly, when the semiconductor member 130 includes the oxide semiconductor described above, the insulating layer 140b of the single layer or the lowest layer of the insulating layer 140b of the multilayer may include the inorganic insulating material in which hydrogen (H) is less included in a gas used in the film formation process, such as silicon oxide (SiOx).

Next, a doping barrier layer 150 is formed on the insulating layer 140b. The doping barrier layer 150 may include a material such as a metal for preventing an impurity such as hydrogen (H), which may be used to dope the semiconductor member 130 to make a conductive region in the later process step, from passing through. For example, when the semiconductor member 130 includes the oxide semiconductor described above, the doping barrier layer 150 may include a metal material such as titanium (Ti) or an oxide semiconductor material.

Figure 11:
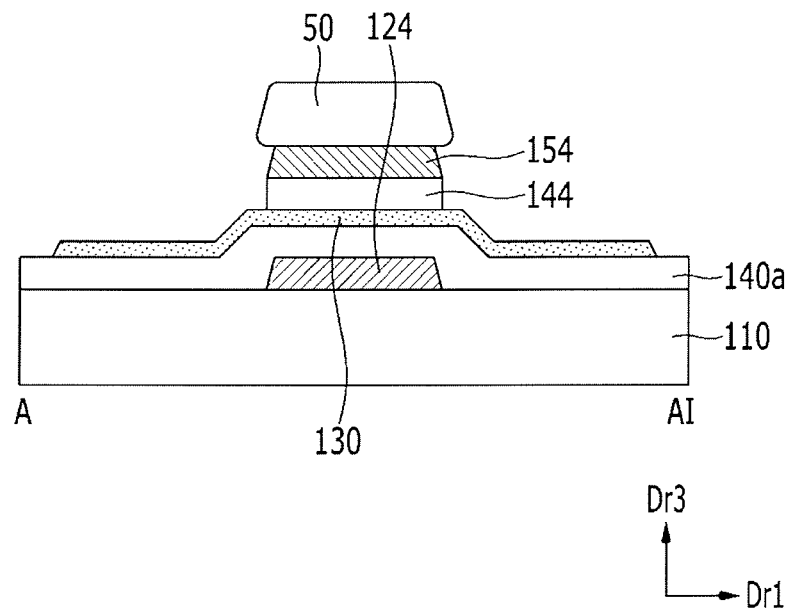

Next, referring to FIG. 11, a mask pattern 50 such as a photoresist is formed on the doping barrier layer 150, and the doping barrier layer 150 and the insulating layer 140b are etched by using the mask pattern 50 as an etching mask to form a barrier pattern 154 and an insulating barrier layer 144 under the barrier pattern 154. In this case, the left and right edges of the barrier pattern 154 and the insulating barrier layer 144 may be substantially aligned with the left and right edges of the gate electrode 124 or may be positioned at a position overlapping the gate electrode 124. Accordingly, a part of the semiconductor member 130 is exposed.

Figure 12:
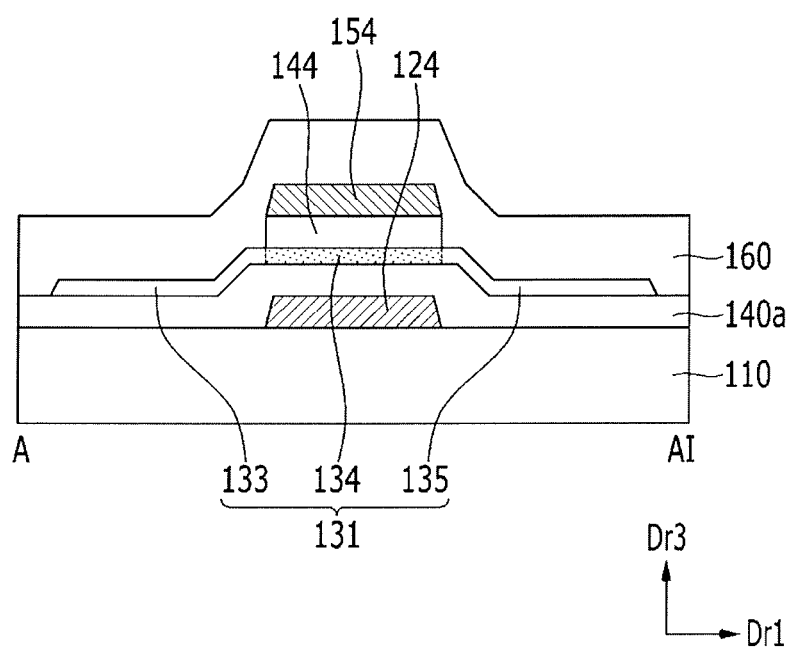

Next, referring to FIG. 12, the mask pattern 50 is removed, and an inorganic insulating material such as, for example, silicon oxide (SiOx), silicon nitride (SiNx), silicon oxynitride (SiON), or silicon oxyfluoride (SiOF), or an organic insulating material is deposited on the barrier pattern 154, the semiconductor member 130, and the gate insulating layer 140a to form an interlayer insulating layer 160 with a structure of a single layer or a multilayer. Particularly, when the semiconductor member 130 includes the oxide semiconductor described above, the interlayer insulating layer 160 of the single layer or the lowest layer of the interlayer insulating layer 160 of the multilayer may include a nitride-based inorganic insulating material such as silicon nitride (SiNx), using a gas including hydrogen such as silane (SiH$_4$) and ammonia (NH$_3$) in the film formation process.

In the film formation process of the interlayer insulating layer 160, a hydrogen (H) component of the gas including hydrogen (H) is penetrated or doped to the semiconductor member 130 that is not covered by the barrier pattern 154, thereby forming a source region 133 and a drain region 135 having conductivity. Hydrogen or the impurity is not penetrated into the semiconductor member 130 covered by the barrier pattern 154 through the barrier pattern 154, thereby forming the channel region 134 maintaining a semiconductor characteristic. Accordingly, the semiconductor member 131 including the source region 133, the drain region 135, and the channel region 134 is formed. After the film formation of the interlayer insulating layer 160, the impurity included in the interlayer insulating layer 160 such as hydrogen may be diffused into the source region 133 and the drain region 135.

According to an exemplary embodiment of the present invention, before forming the interlayer insulating layer 160, the semiconductor member 130 that is not covered by the barrier pattern 154 may be subjected to a reduction treatment or an n+ doping treatment to form the source region 133 and the drain region 135. In this case, as the treatment method, for example, there may be a heat treatment in a reduction atmosphere, a plasma treatment method using a gas plasma such as, for example, hydrogen (H$_2$), helium (He), phosphine (PH$_3$), ammonia (NH$_3$), silane (SiH$_4$), methane (CH$_4$), acetylene (C$_2$H$_2$), diborane (B$_2$H$_6$), carbon dioxide (CO$_2$), germane (GeH$_4$), hydrogen selenide (H$_2$Se), hydrogen sulfide (H$_2$S), argon (Ar), nitrogen (N$_2$), nitrogen oxide (N$_2$O), fluoroform (CHF$_3$), or any combination thereof.

Figure 13:
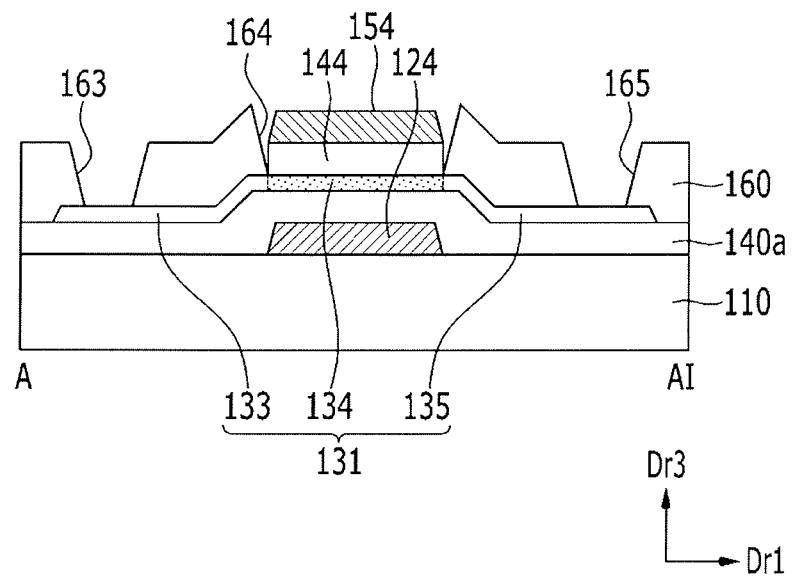

Next, referring to FIG. 13, the interlayer insulating layer 160 is patterned by a method such as an etching to form a hole 163 exposing the source region 133, a hole 165 exposing the drain region 135, and a hole 164 exposing the barrier pattern 154. The hole 164 may expose the entire portion of the barrier pattern 154, as shown in FIG. 13.

At least one of the hole 163 and the hole 165 may be omitted depending on the kind of the thin film transistor to be formed.

Figure 14:
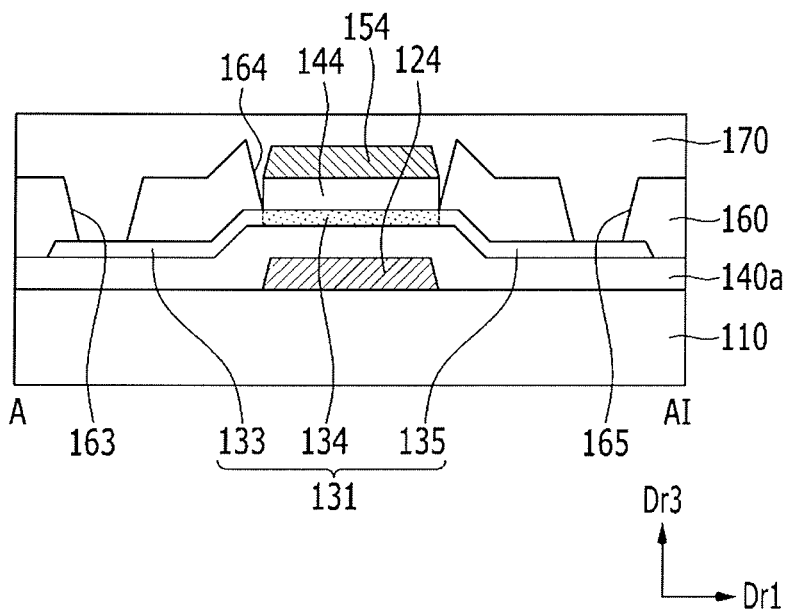

Next, referring to FIG. 14, the conductive material including a metal such as, for example, aluminum, silver, copper, molybdenum, chromium, tantalum, or titanium, or any alloy thereof, is deposited on the interlayer insulating layer 160 to form a conductive layer 170 with a structure of a single layer or a multilayer.

Figure 15:
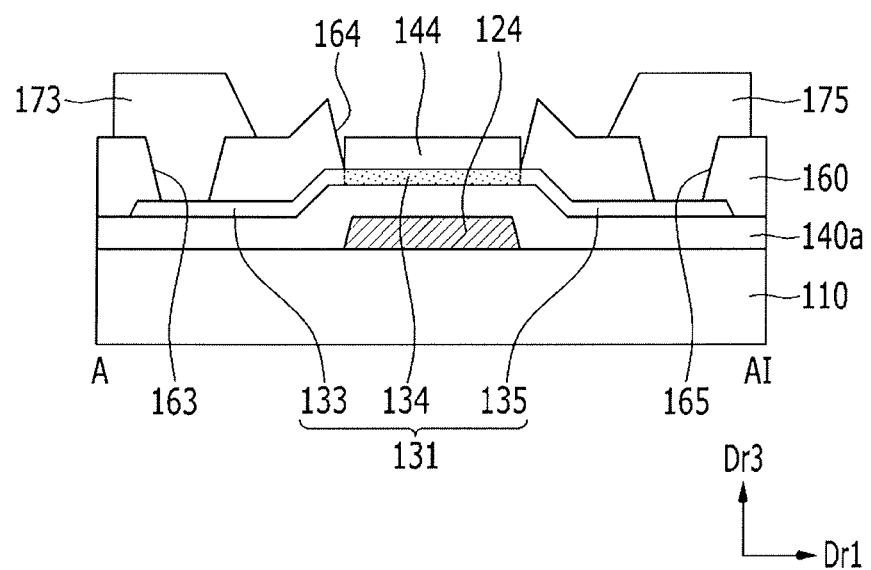

Next, referring to FIG. 15, the conductive layer 170 is patterned through an etching to form a data conductor including a first connection part 173 connected to the source region 133 and a second connection part 175 connected to the drain region 135. The barrier pattern 154 may be removed by the etching along with the patterning of the conductive layer 170. Alternatively, the barrier pattern 154 may be removed by an etching after patterning the conductive layer 170. Accordingly, as shown in FIG. 15, the upper surface of the insulating barrier layer 144 may be exposed. As described above, because the barrier pattern 154 is removed, the conductor causing the short of the first connection part 173 and the second connection part 175 is removed on the channel region 134, thereby realizing high resolution for the thin film transistor array panel and the display device including the same.

As described above, referring to FIG. 1 and FIG. 2, at least one of an inorganic insulating material and an organic insulating material is deposited on the insulating barrier layer 144, the first connection part 173, and the second connection part 175 to form a passivation layer 180 with a structure of a single layer or a multilayer.

According to an exemplary embodiment of the present invention, the thin film transistor may be manufactured differently from that shown in FIG. 10 to FIG. 14. For example, the doping barrier layer 150 and the barrier pattern 154 may be omitted and only the insulating barrier layer 144 may prevent the semiconductor member 130 from being doped with hydrogen or the impurity. In this case, the insulating barrier layer 144 may have a sufficient thickness to prevent the penetration of hydrogen or the impurity.

Figure 16:
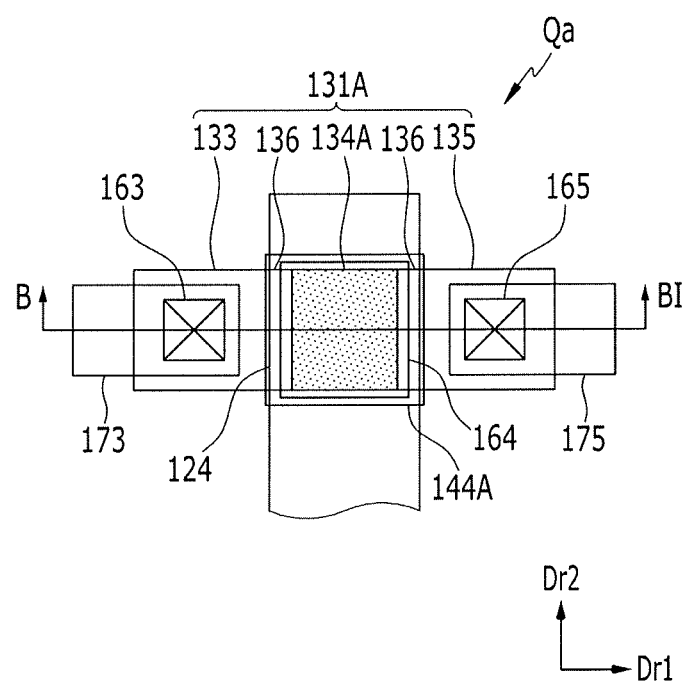
FIG. 16 is a top plan view of a thin film transistor included in a thin film transistor array panel according to an exemplary embodiment of the present invention.
Figure 17:
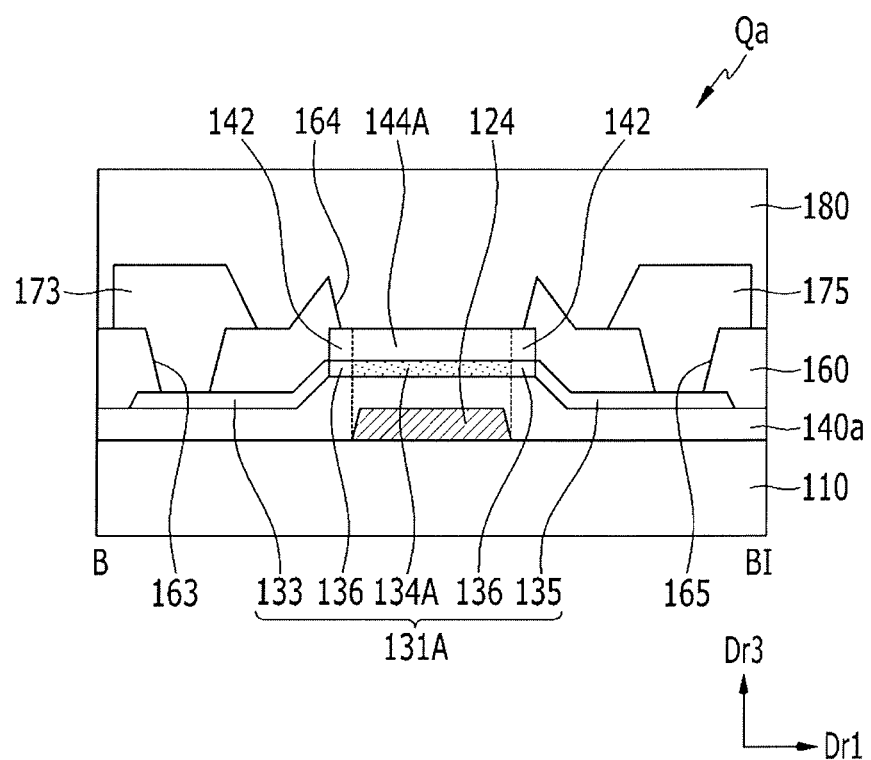
FIG. 17 is a cross-sectional view of the thin film transistor array panel shown in FIG. 16 taken along line B-BI.

Next, the thin film transistor array panel according to an exemplary embodiment of the present invention will be described with reference to FIG. 16 and FIG. 17. Like reference numerals are provided for the same constituent elements as in the above-described exemplary embodiment, the same description thereof is omitted, and differences are mainly described.

The thin film transistor array panel according to an exemplary embodiment of the present invention includes the thin film transistor Qa. The thin film transistor array panel according to the present exemplary embodiment is almost the same as the thin film transistor array panel according to the exemplary embodiment shown in FIG. 1 and FIG. 2 except for a structure of a semiconductor member 131A, an insulating barrier layer 144A, and an interlayer insulating layer 160.

The semiconductor member 131A may be positioned on a gate insulating layer 140a and may include a channel region 134A, a source region 133, a drain region 135, and a buffer region 136. The channel region 134A, the source region 133, and the drain region 135 are the same as the channel region 134, the source region 133, and the drain region 135 of the above-described exemplary embodiment such that the detailed description thereof is omitted.

The buffer region 136 is positioned between the channel region 134A and the source region 133 and between the channel region 134A and the drain region 135, and is referred to as a low conductive region. A carrier concentration of the buffer region 136 is higher than a carrier concentration of the channel region 134A, but is lower than a carrier concentration of the source region 133 and the drain region 135. The buffer region 136 may have lower conductivity than the source region 133 and the drain region 135. Also, the carrier concentration of the buffer region 136 may be gradually reduced from the source region 133 and the drain region 135 toward the channel region 134A.

The metal such as indium (In) included in the semiconductor member 131A may be precipitated at the surface of the buffer region 136.

An insulating barrier layer 144A is positioned on the semiconductor member 131A. The insulating barrier layer 144A is almost the same as the insulating barrier layer 144 of the above-described exemplary embodiment, but the insulating barrier layer 144A may also include an outer part 142 positioned on the buffer region 136 as well as the channel region 134A. The outer part 142 may overlap the buffer region 136 on a plane. Accordingly, the width of the insulating barrier layer 144A in the first direction Dr1 may be substantially the same as or slightly larger than the entire width including the channel region 134A and the buffer regions 136 of both sides in the first direction Dr1. In other words, the entire left and right edges of the channel region 134A and both sides of the buffer region 136, that is, the boundary between the buffer region 136 and the source region 133 and the boundary between the buffer region 136 and the drain region 135, may be aligned with the right and left edges of the insulating barrier layer 144A or overlap the insulating barrier layer 144A on a plane. On the other hand, the right and left edges of the gate electrode 124 may be aligned with the right and left boundaries between the channel region 134A and the buffer regions 136.

The interlayer insulating layer 160 positioned on the semiconductor member 131A is almost the same as the interlayer insulating layer 160 of the above-described exemplary embodiment, however the interlayer insulating layer 160 may not cover most of the insulating barrier layer 144A in the hole 164. The interlayer insulating layer 160, as shown in FIG. 17, may cover and overlap a part of the left and right edges of the insulating barrier layer 144A. The width of the hole 164 in the first direction Dr1 may be equal to or larger than the width of the channel region 134A in the first direction Dr1, and the plane size of the hole 164 may be equal to or larger than the plane size of the channel region 134A. The width of the hole 164 in the first direction Dr1 may be smaller than the width of the semiconductor member 131A in the first direction Dr1.

According to the present exemplary embodiment, the carrier concentration between the channel region 134A and the source region 133 or between the channel region 134A and the drain region 135 is gradually changed such that generation of a hot carrier may be suppressed and a channel length of the channel region 134A may be prevented from being shortened. Accordingly, a sharp increase of the current flowing into the channel region 134A may be prevented. Also, even if the high source-drain voltage (Vds) is applied to the thin film transistor Qa, intensity of the electric field applied to the semiconductor member 131A by the buffer region 136 is smoothened such that the reliability against the high voltage stress of the thin film transistor Qa may be further enhanced and a stable characteristic may appear.

Next, the manufacturing method of a thin film transistor array panel according to an exemplary embodiment of the present invention will be described with reference to FIG. 18 to FIG. 22 along with the above-described drawings. Particularly, the manufacturing method of the thin film transistor array panel according to the exemplary embodiment shown in FIG. 16 and FIG. 17 will be described.

As shown in FIG. 9 and FIG. 10 and as described above, a gate electrode 124, a gate insulating layer 140a, a semiconductor member 130, an insulating layer 140b, and a doping barrier layer 150 are sequentially formed on a substrate 110.

Figure 18:
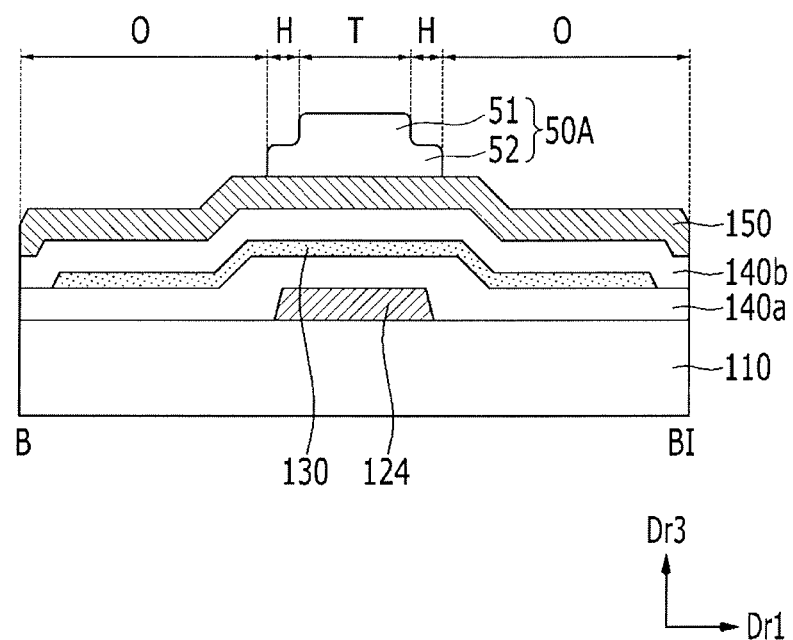
FIG. 18 to FIG. 22 are cross-sectional views sequentially showing a structure in each process according to a manufacturing method of a thin film transistor array panel according to an exemplary embodiment of the present invention.

Next, referring to FIG. 18, a mask pattern 50A such as a photoresist is formed on the doping barrier layer 150. The mask pattern 50A may include a first portion 51 of which the cross-sectional thickness is relatively thick and a second portion 52 of which the cross-sectional thickness is relatively thin. The boundaries between the first portion 51 and the second portion 52 may be almost aligned with the left and right edges of the gate electrode 124.

Figure 19:
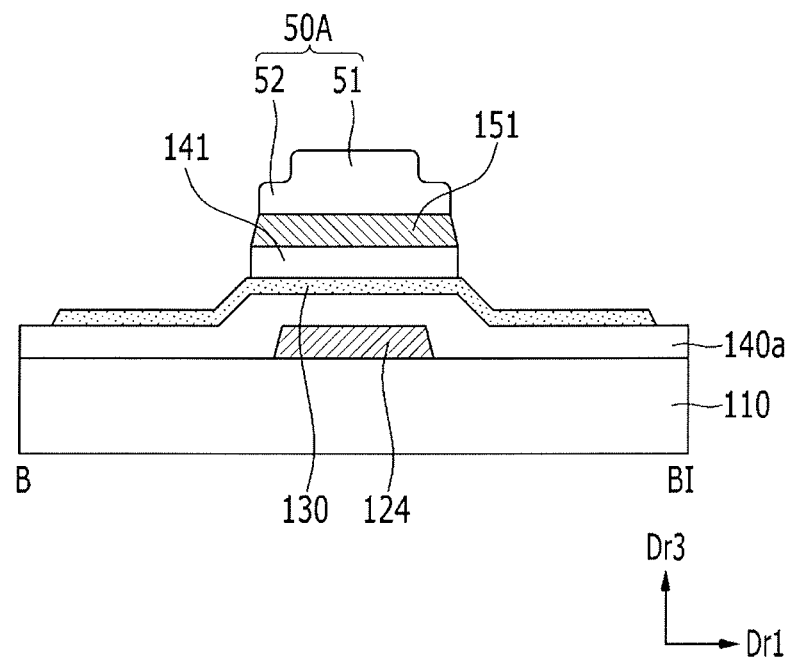

Next, referring to FIG. 19, the doping barrier layer 150 and the insulating layer 140b are etched by using the mask pattern 50A as an etching mask to form a barrier pattern 151 and an insulating layer pattern 141 under the barrier pattern 151. In this case, the width of the barrier pattern 151 and the insulating layer pattern 141 in the first direction Dr1 may be larger than the width of the gate electrode 124 in the first direction Dr1.

Figure 20:
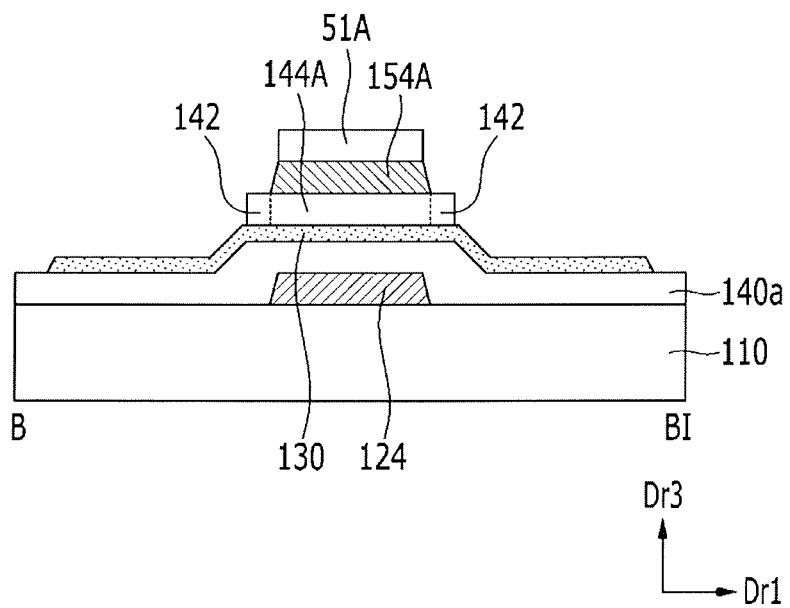

Next, referring to FIG. 20, the thickness of the mask pattern 50A is reduced by a method such as ashing to remove the second portion 52 and to form a mask pattern 51A. Accordingly, an edge part of the barrier pattern 151 is exposed.

Next, the exposed edge part of the barrier pattern 151 is etched by using the mask pattern 51A as an etching mask to form a barrier pattern 154A. The insulating layer pattern 141 becomes the insulating barrier layer 144A including the portion that is covered by the barrier pattern 154A, and an outer part 142 that is not covered by the barrier pattern 154A and is exposed. That is, the edge part (the outer part 142) of the insulating barrier layer 144A is not covered by the barrier pattern 154A, and is exposed.

Figure 21:
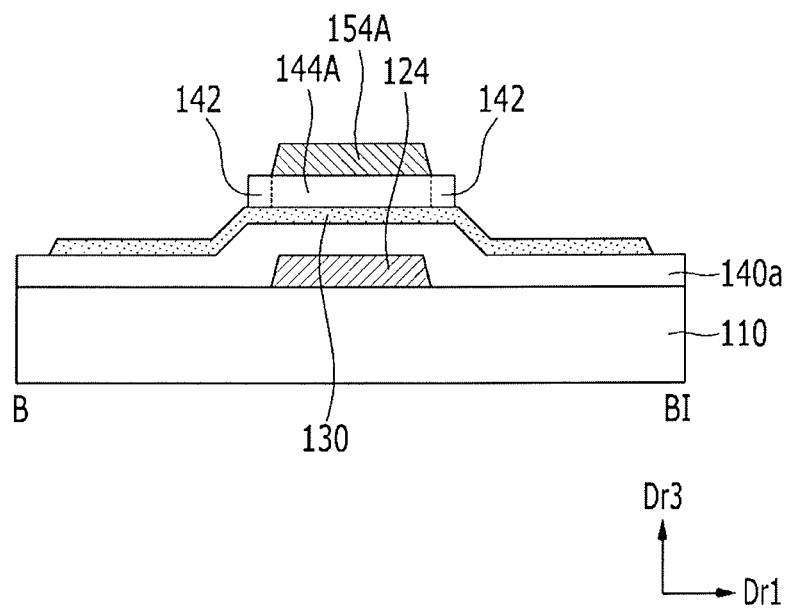

Next, referring to FIG. 21, the mask pattern 51A is removed by a method such as ashing.

Figure 22:
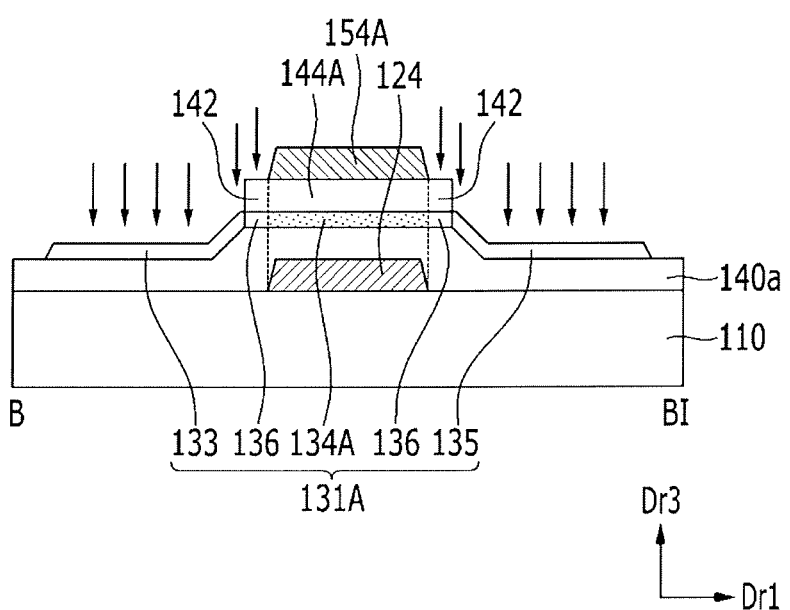

Referring to FIG. 22, the reduction treatment or the n+ doping treatment is then performed on the semiconductor member 131A that is not covered by the barrier pattern 154A to form the source region 133, the drain region 135, and the buffer region 136. In this case, heat treatment in a reduction atmosphere or plasma treatment using a gas plasma such as hydrogen ($H_2$) may be performed.

The semiconductor member 131A covered by the barrier pattern 154A forms the channel region 134A. The semiconductor member 131A that only overlaps the insulating barrier layer 144A while not being overlapped with the barrier pattern 154A, that is, the region of the semiconductor member 131A overlapping the outer part 142 of the insulating barrier layer 144A, has the treatment weaker than the treatment of the source region 133 and the drain region 135, thereby forming the buffer region 136 having a conductivity lower than that of the source region 133 and the drain region 135. The carrier concentration is gradually changed in the buffer region 136 between the channel region 134A and the source region 133 or in the buffer region 136 between the channel region 134A and the drain region 135.

During the reduction treatment of the semiconductor member 131A, the metal component of the semiconductor material may be precipitated onto the surface of the source region 133, the drain region 135, and the buffer region 136.

Next, an inorganic insulating material such as, for example, silicon oxide (SiOx), silicon nitride (SiNx), silicon oxynitride (SiON), or silicon oxyfluoride (SiOF), or an organic insulating material is deposited on the barrier pattern 154A, the semiconductor member 131A, and the gate insulating layer 140a. Accordingly, the above-described interlayer insulating layer 160 as shown in FIG. 16 and FIG. 17 is formed.

In the film formation of the interlayer insulating layer 160, the hydrogen (H) component of the gas including hydrogen (H) is penetrated or doped into the semiconductor member 131A that is not covered by the barrier pattern 154A, such that the source region 133, the drain region 135, and the buffer region 136 having conductivity may be formed. In this case, before forming the above-described interlayer insulating layer 160, the treatment for the semiconductor member 130 may not be executed.

Next, the interlayer insulating layer 160 is patterned to form a hole 163 exposing the source region 133, a hole 165 exposing the drain region 135, and a hole 164 exposing the barrier pattern 154A, and then a conductive layer such as a metal is formed on the interlayer insulating layer 160 and is patterned to form a data conductor including a first connection part 173 connected to the source region 133 and a second connection part 175 connected to the drain region 135. In this case, the barrier pattern 154A may also be removed along with the patterning of the conductive layer or after the patterning of the conductive layer. Next, a passivation layer 180 may be formed on the insulating barrier layer 144A, the first connection part 173, and the second connection part 175.

The thin film transistor array panel according to an exemplary embodiment of the present invention will now be described with reference to FIG. 23 and FIG. 24. Like reference numerals are provided for the same constituent elements as in the above-described exemplary embodiment, the same description thereof is omitted, and differences are mainly described.

A thin film transistor array panel according to an exemplary embodiment of the present invention includes a thin film transistor Qb. The thin film transistor array panel according to the present exemplary embodiment is almost the same as the thin film transistor array panel according to the exemplary embodiment shown in FIG. 1 and FIG. 2, however the insulating barrier layer 144 of the above-described exemplary embodiment may not be positioned between the channel region 134 and the passivation layer 180, and the structure of the interlayer insulating layer 160 may be different from the structure of the interlayer insulating layer 160 of the above-described exemplary embodiment.

The interlayer insulating layer 160 may have a hole 163A overlapping the source region 133, a hole 165A overlapping the drain region 135, and a hole 164A overlapping the channel region 134 and positioned on the channel region 134.

The first connection part 173 and the second connection part 175 may be connected directly to the source region 133 and the drain region 135 in the holes 163A and 165A, respectively, and may cover the right and left edges of the semiconductor member 131.

In the hole 164A, the interlayer insulating layer 160 may not cover most of the channel region 134. The channel region 134 may completely overlap the hole 164A, and the plane size of the hole 164A may be equal to or larger than the plane size of the channel region 134.

Figure 24:
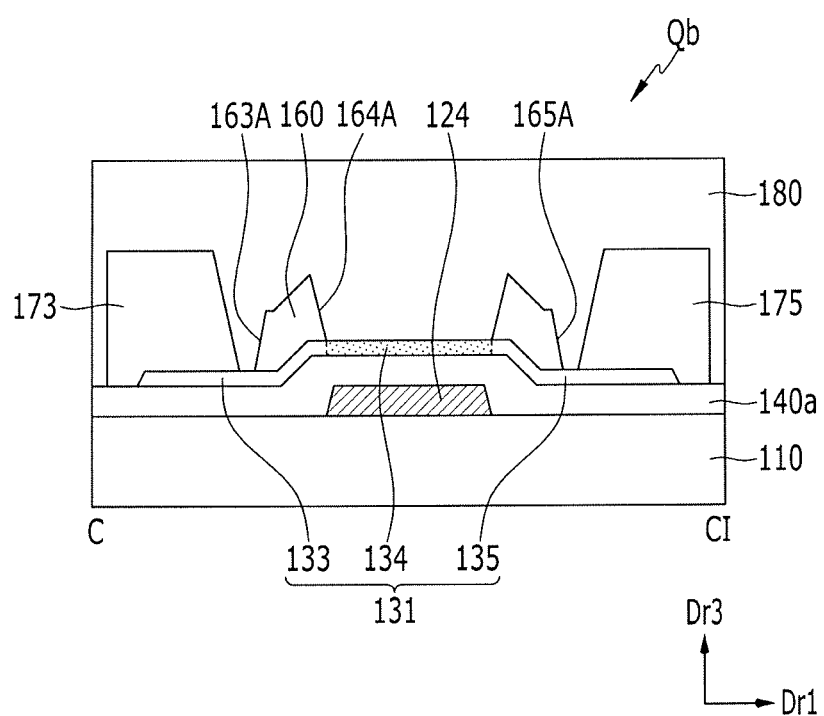
FIG. 24 is a cross-sectional view of the thin film transistor array panel shown in FIG. 23 taken along line C-CI.
Figure 25:
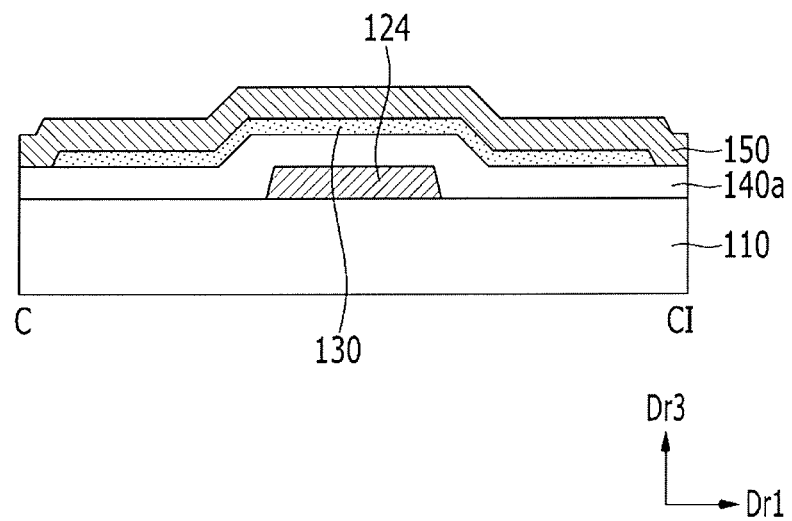
FIG. 25 to FIG. 30 are cross-sectional views sequentially showing a structure in each process according to a manufacturing method of a thin film transistor array panel according to an exemplary embodiment of the present invention.

The thin film transistor Qb may be configured differently from that shown in FIG. 24. For example, the interlayer insulating layer 160 positioned on the semiconductor member 131 may all be removed.

The passivation layer 180 may be in contact with the upper surface of the channel region 134, and may be in the hole 164A.

Next, a manufacturing method of the thin film transistor array panel according to an exemplary embodiment of the present invention will be described with reference to FIG. 25 to FIG. 30 along with the above-described drawings.

First, after sequentially forming a gate electrode 124, a gate insulating layer 140a, and a semiconductor member 130 on a substrate 110, a doping barrier layer 150 is formed on the semiconductor member 130 and the gate insulating layer 140a. The doping barrier layer 150 may include a material, such as a metal, for preventing the material such as hydrogen (H) or the impurity from passing through. For example, when the semiconductor member 130 includes the oxide semiconductor described above, the doping barrier layer 150 may include a metal material such as titanium (Ti).

Figure 26:
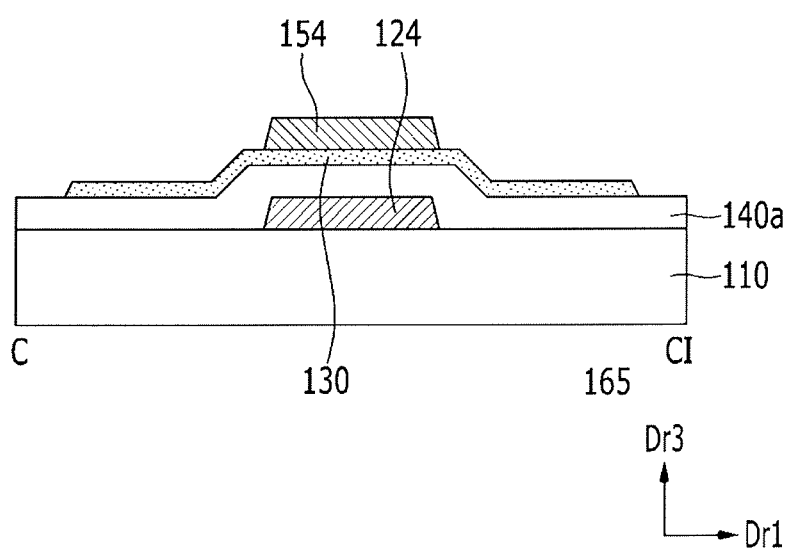

Next, referring to FIG. 26, the doping barrier layer 150 is patterned to form a barrier pattern 154. The left and right edges of the barrier pattern 154 may be almost aligned with the left and right edges of the gate electrode 124 or may overlap the gate electrode 124 on a plane.

Figure 27:
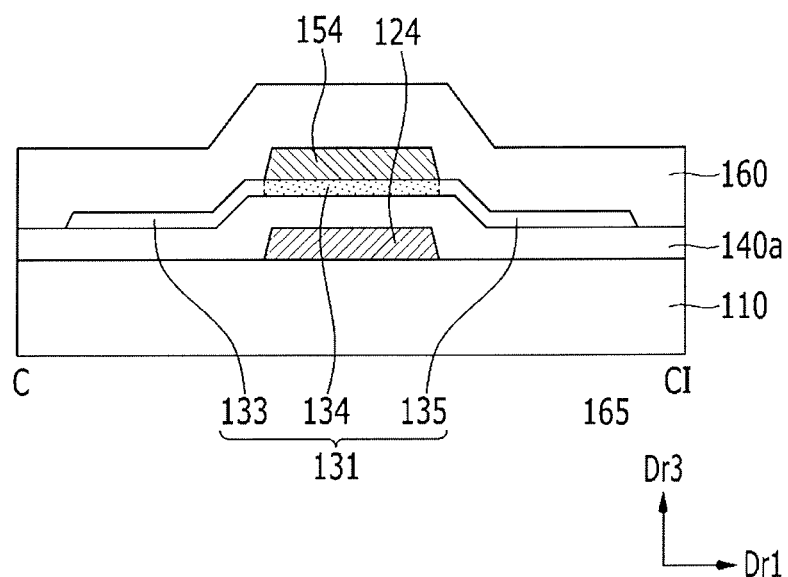

Next, referring to FIG. 27, an interlayer insulating layer 160 is formed on the barrier pattern 154, the semiconductor member 130, and the gate insulating layer 140a. As described above, in the film formation process of the interlayer insulating layer 160, the semiconductor member 130 that is not covered by the barrier pattern 154 becomes the source region 133 and the drain region 135 having conductivity, and the semiconductor member 130 covered by the barrier pattern 154 becomes the channel region 134, thereby forming the semiconductor member 131.

According to an exemplary embodiment of the present invention, before forming the interlayer insulating layer 160, the semiconductor member 130 that is not covered by the barrier pattern 154 may be subjected to the reduction treatment or the n+ doping treatment to form the source region 133 and the drain region 135.

Figure 28:
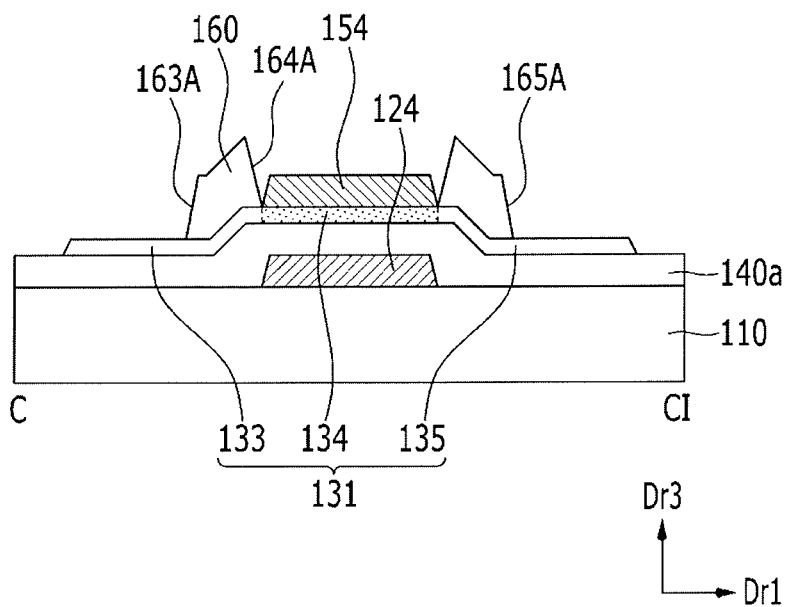

Next, referring to FIG. 28, the interlayer insulating layer 160 is patterned to form a hole 163A exposing the source region 133, a hole 165A exposing the drain region 135, and a hole 164A exposing the barrier pattern 154. The hole 164A may expose the entire barrier pattern 154. Alternatively, most of the interlayer insulating layer 160 positioned on the semiconductor member 131 may be removed.

Figure 29:
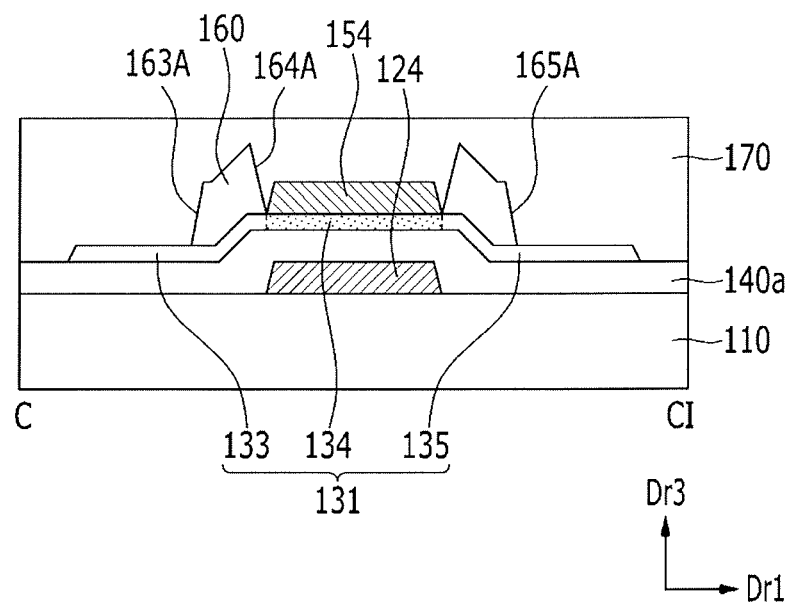

Next, referring to FIG. 29, a conductive layer 170 including a metal is formed on the interlayer insulating layer 160. The conductive layer 170 may be in contact with the upper surface of the barrier pattern 154.

Figure 30:
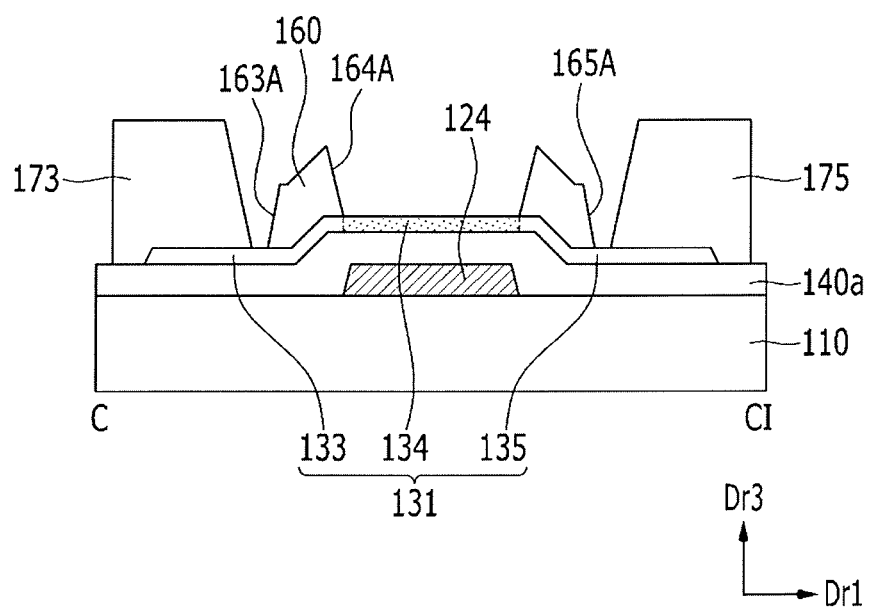

Next, referring to FIG. 30, the conductive layer 170 is patterned to form the data conductor including the first connection part 173 and the second connection part 175. The barrier pattern 154 is also removed along with the patterning of the conductive layer 170 such that the upper surface of the channel region 134 may be exposed. Alternatively, the barrier pattern 154 may be removed by etching after patterning of the conductive layer 170.

Figure 23:
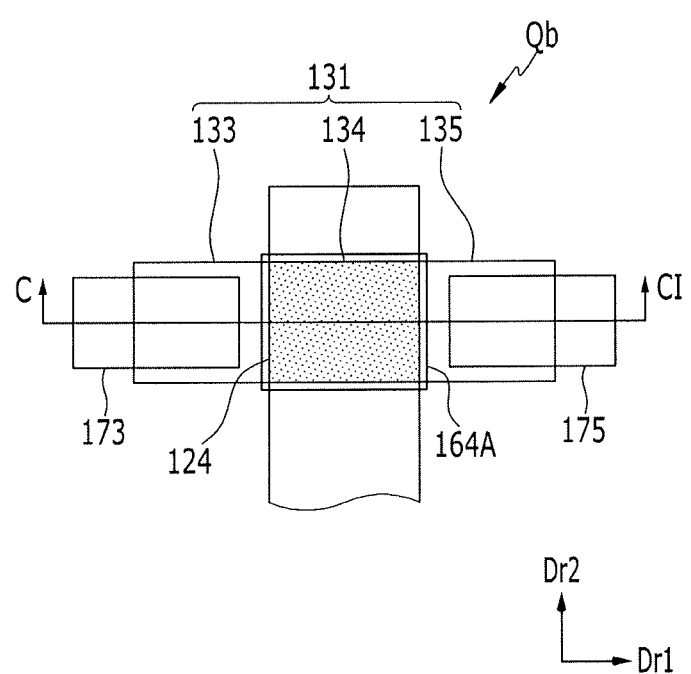
FIG. 23 is a top plan view of a thin film transistor included in a thin film transistor array panel according to an exemplary embodiment of the present invention.

Next, referring to FIG. 23 and FIG. 24, a passivation layer 180 is formed on the first connection part 173 and the second connection part 175.

A structure of the thin film transistor array panel according to an exemplary embodiment of the present invention will now be described with reference to FIG. 31 and FIG. 32. The same constituent elements as in the structure described above are designated by the same reference numerals, a duplicated description is omitted, and differences will be mainly described.

Figure 31:
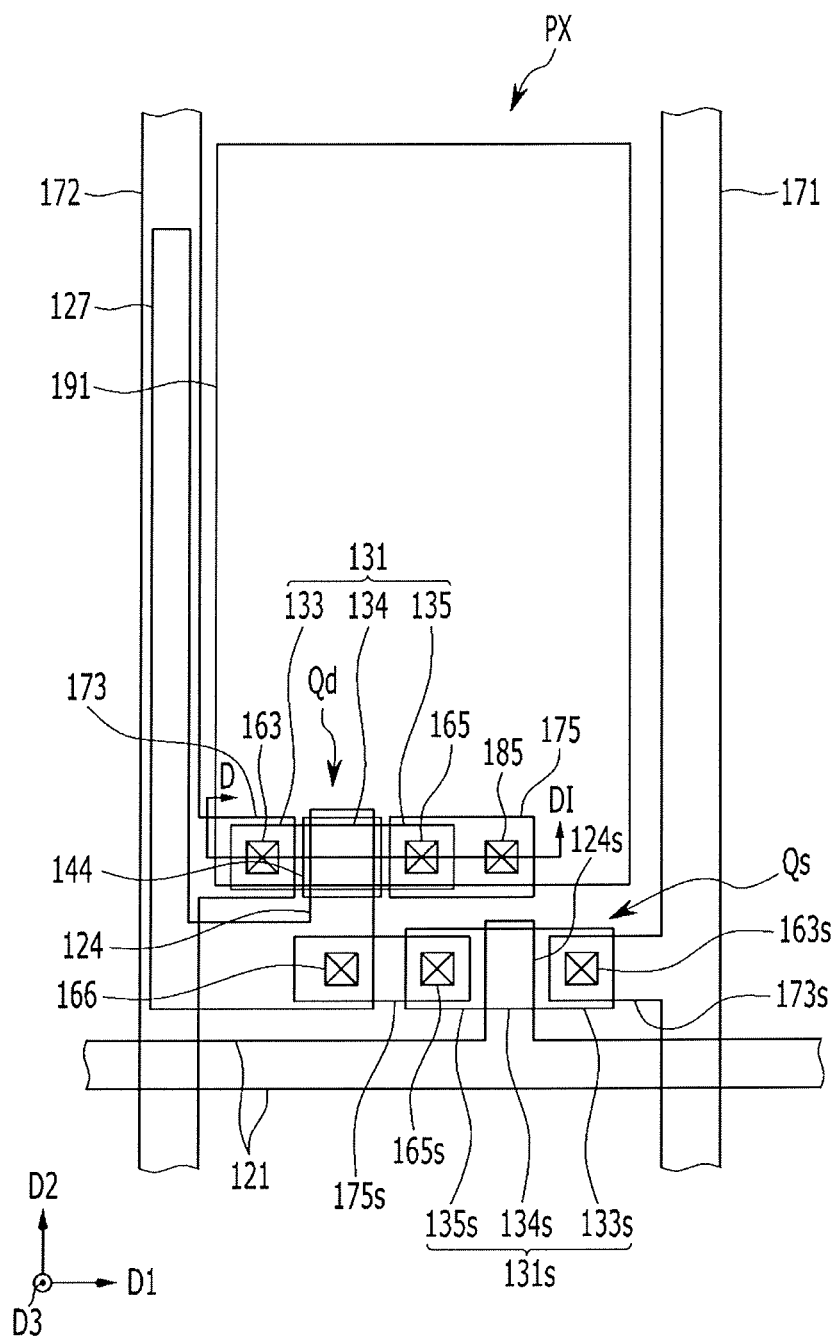
FIG. 31 is a layout view of a pixel of a display device including a thin film transistor array panel according to an exemplary embodiment of the present invention.
Figure 32:
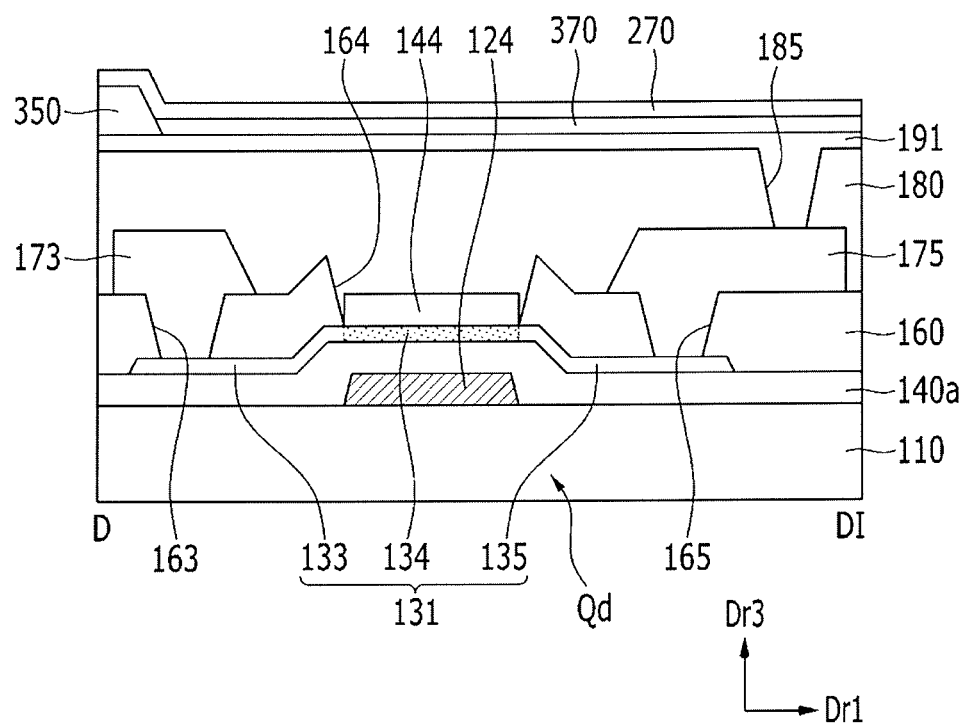
FIG. 32 is a cross-sectional view of the display device shown in FIG. 31 taken along line D-DI.

Referring to FIG. 31 and FIG. 32, one pixel PX as a unit displaying an image in the thin film transistor array panel according to an exemplary embodiment of the present invention includes a driving transistor Qd positioned on one surface of a substrate 110, and the driving transistor Qd has a structure the same as those of the thin film transistors Q, Qa, and Qb according to the above-described exemplary embodiments. FIG. 32 shows a cross-sectional structure of the driving transistor Qd with the structure the same as that of the thin film transistor Q according to the exemplary embodiment shown in FIG. 1 and FIG. 2.

Referring to FIG. 31, a gate line 121 transmitting a gate signal, a data line 171 transmitting a data signal, a driving voltage line 172 transmitting a driving voltage, a switching transistor Qs including a switching semiconductor member 131s and a switching gate electrode 124s, a third connection part 173s, and a fourth connection part 175s may be further positioned on the substrate 110.

The gate line 121 may mainly extend in the first direction Dr1, and the data line 171 and the driving voltage line 172 may mainly extend in the second direction Dr2.

The first connection part 173 connected to the driving transistor Qd is connected to the driving voltage line 172, thereby receiving the driving voltage.

The switching semiconductor member 131s includes a channel region 134s in which the channel of the switching transistor Qs is formed, and a source region 133s and a drain region 135s positioned at respective sides of the channel region 134s. The switching semiconductor member 131s may include a material the same as that of the semiconductor member 131, thereby being positioned at the same layer as the semiconductor member 131, or may include a different semiconductor material, thereby being positioned at a different layer from the semiconductor member 131. For example, the switching semiconductor member 131s may include polysilicon, and the semiconductor member 131 may include oxide semiconductor.

The switching gate electrode 124s overlaps the channel region 134s with the gate insulating layer 140a or another insulating layer interposed therebetween. The switching gate electrode 124s may be positioned at the same layer as the gate electrode 124 of the driving transistor Qd. The switching gate electrode 124s is connected to the gate line 121 thereby receiving the gate signal.

The interlayer insulating layer 160 may have a hole 163s positioned on the source region 133s and a hole 165s positioned on the drain region 135s of the switching transistor Qs, and the interlayer insulating layer 160 and the gate insulating layer 140a may have a hole 166 positioned on the fourth connection part 175s.

The third connection part 173s and the fourth connection part 175s may be positioned on the interlayer insulating layer 160. The third connection part 173s may be electrically connected to the source region 133s through the hole 163s, and the fourth connection part 175s may be electrically connected to the drain region 135s through the hole 165s. The third connection part 173s may be connected to the data line 171 to receive a data signal and transmit the data signal to the switching transistor Qs. The fourth connection part 175s may be electrically connected to the gate electrode 124 of the driving transistor Qd through the hole 166.

The gate electrode 124 may be connected to a conductor 127. The conductor 127 may mainly overlap the driving voltage line 172 with the interlayer insulating layer 160 and the gate insulating layer 140a interposed therebetween.

The passivation layer 180 is positioned on the second connection part 175, and may have a hole 185 overlapping the second connection part 175.

A pixel electrode 191 may be positioned on the passivation layer 180. The pixel electrode 191 is connected to the second connection part 175 through the hole 185 thereby receiving the drain voltage. A pixel definition layer 350 may be positioned on the passivation layer 180. The pixel definition layer 350 may cover a part of the edge of the pixel electrode 191. An emission layer 370 is positioned on the pixel electrode 191 that is not covered by the pixel definition layer 350, and a common electrode 270 is positioned on the emission layer 370. The pixel electrode 191, the emission layer 370, and the common electrode 270 may together form an organic light emitting diode.

As described above, the display device including the thin film transistor array panel according to an exemplary embodiment of the present invention may easily realize high resolution as described above and may be driven with lower power, and may provide an image with good quality by the thin film transistor having the enhanced characteristic.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel comprising:
a substrate;
a gate electrode on the substrate;
a gate insulating layer on the gate electrode;
a semiconductor member including a channel region overlapping the gate electrode with the gate insulating layer interposed therebetween, and a source region and a drain region that face each other with the channel region interposed therebetween;
an interlayer insulating layer on the semiconductor member;
a data conductor on the interlayer insulating layer; and
a passivation layer on the data conductor,
wherein the interlayer insulating layer has a first hole on the channel region, and a second hole on the source region or the drain region,
the first hole and the second hole are separated from each other such that the interlayer insulating layer remains between the first hole and the second hole in a plan view, and
the data conductor is connected to the source region or the drain region via the second hole.

2. The thin film transistor array panel of claim 1, wherein the passivation layer includes a portion positioned in the first hole.

3. The thin film transistor array panel of claim 2, wherein a plane separation distance between the data conductor and the gate electrode is naught or greater than zero.

4. The thin film transistor array panel of claim 3, further comprising
an insulating harrier layer on the channel region,
wherein a width of the insulating barrier layer in a first direction is smaller than a width of the semiconductor member in the first direction, and
a width of the first hole in the first direction is equal to or greater than a width of the channel region in the first direction.

5. The thin film transistor array panel of claim 4, wherein the passivation layer is in contact with an upper surface of the insulating barrier layer in the first hole.

6. The thin film transistor array panel of claim 5, wherein the insulating barrier layer includes silicon oxide, and the interlayer insulating layer includes silicon nitride.

7. The thin film transistor array panel of claim 5, wherein an edge of the gate electrode is aligned with an edge of the channel region.

8. The thin film transistor array panel of claim 3, wherein the passivation layer is in contact with an upper surface of the channel region in the first hole.

9. The thin film transistor array panel of claim 8, wherein an edge of the gate electrode is aligned with an edge of the channel region.

10. The thin film transistor array panel of claim 8, wherein the interlayer insulating layer includes silicon nitride.

11. The thin film transistor array panel of claim 3, wherein the semiconductor member further includes a buffer region positioned between the source region and the channel region, and
a carrier concentration of the buffer region is between a carrier concentration of the source region and a carrier concentration of the channel region.

12. The thin film transistor array panel of claim 11, wherein
an edge of the gate electrode is aligned with a boundary between the channel region and the buffer region.

13. The thin film transistor array panel of claim 1, further comprising
an insulating barrier layer disposed on the channel region,
wherein an edge of the insulating barrier layer is aligned with an edge of the gate electrode in a plan view.

14. The thin film transistor array panel of claim 1, further comprising a insulating barrier layer disposed on the channel region,
wherein an edge of the channel region is aligned with an edge of the insulating barrier layer or overlapped with the insulating barrier layer.

* * * * *